(12) United States Patent
Hirata

(10) Patent No.: US 6,414,976 B1
(45) Date of Patent: Jul. 2, 2002

(54) SEMICONDUCTOR LIGHT EMITTING DEVICE

(75) Inventor: Shoji Hirata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/350,292

(22) Filed: Jul. 9, 1999

(30) Foreign Application Priority Data

| Jul. 15, 1998 | (JP) | 10-200354 |
| Oct. 1, 1998 | (JP) | 10-279803 |
| May 18, 1999 | (JP) | 11-137180 |

(51) Int. Cl.[7] ............................................. H01S 5/00
(52) U.S. Cl. ..................................... 372/45; 372/43
(58) Field of Search ........................ 372/45, 46, 43, 372/44, 50

(56) References Cited

U.S. PATENT DOCUMENTS

| 5,953,357 A | * | 9/1999 | Hirata et al. | 372/46 |
| 5,974,068 A | * | 10/1999 | Adachi et al. | 372/46 |
| 6,002,701 A | * | 12/1999 | Kan et al. | 372/46 |
| 6,018,539 A | * | 1/2000 | Kimura et al. | 372/45 |
| 6,037,189 A | * | 3/2000 | Goto | 438/31 |
| 6,174,747 B1 | * | 1/2001 | Ho et al. | 438/31 |
| 6,195,375 B1 | * | 2/2001 | Hirata | 372/46 |
| 6,222,867 B1 | * | 4/2001 | Inomoto et al. | 372/50 |

* cited by examiner

Primary Examiner—Paul Ip
Assistant Examiner—Jeffrey Zahn
(74) Attorney, Agent, or Firm—Sonnenschein, Nath & Rosenthal

(57) ABSTRACT

A semiconductor light emitting device capable of correcting astigmatism difference well and oscillating stably also at the time of a high output operation, wherein a waveguide stripe width at the center of a stripe portion is constant, an inter-ridge recessed portion width (ridge separation width) is set narrow at the center portion of the stripe portion (resonator center portion), and a ridge separation width near an end surface side is set broader than the ridge separation width at the center portion, whereby a waveguide mode of the stripe center portion is laterally spread and in addition the current can be held in the narrow region and, accordingly, a saturable absorbing region is formed in the lateral region inside an active layer, pulsation can be stably induced, and an effective refractive index difference An near the end surface is made large and an index guide-like waveguide can be obtained, whereby astigmatism difference can be reduced to close to zero.

22 Claims, 29 Drawing Sheets

200c

200d

SEMICONDUCTOR LIGHT EMITTING DEVICE

BACKGROUND OF THE INVENTION

1. Field of the Invention

The present invention relates to a semiconductor light emitting device, more particularly relates to a semiconductor laser.

2. Description of the Related Art

FIG. 28 is a sectional view of an example of the configuration of a self-pulsation type semiconductor laser of the related art using a so-called a buried ridge structure.

Note that, here, a case where the self-pulsation type semiconductor laser is constituted by an AlGaAs-based material is shown.

As shown in FIG. 28, in this self-pulsation type semiconductor laser 10, an n-type GaAs substrate 11 has successively stacked on it an n-type AlGaAs cladding layer 12, an AlGaAs active layer 13, a p-type AlGaAs cladding layer 14, and a p-type GaAs cap layer 15.

The upper layer portion of the p-type AlGaAs cladding layer 14 and the p-type GaAs cap layer 15 have mesa-type stripe shapes extending in one direction.

Namely, a stripe portion 16 is constituted by these upper layer portion of the p-type AlGaAs cladding layer 14 and the p-type GaAs cap layer 15.

At the two side portions of this stripe portion 16 are buried a GaAs current narrowing layers 17. A GaAs current narrowing structure is formed by this.

On the p-type GaAs cap layer 15 and the GaAs current narrowing layers 17 is provided a p-side electrode 18 such as for example a Ti/Pt/Au electrode.

On the other hand, on the back surface of the n-type GaAs substrate 11 is provided an n-side electrode 19 such as for example an AuGe/Ni/Au electrode.

FIG. 29 is a schematic graph of the distribution of the refractive index of the self-pulsation type semiconductor laser 10 shown in FIG. 28.

Here, the distribution of the refractive index of the region in which light is guided in a direction parallel to a pn junction of the self-pulsation type semiconductor laser 10 and then perpendicular to a resonator length direction (hereinafter this direction will be referred to as a lateral direction) is shown in correspondence to FIG. 28.

As shown in FIG. 29, the self-pulsation type semiconductor laser 10 has a so-called step-like distribution of the refractive index in the lateral direction, where the refractive index n1 in a part corresponding to the stripe portion 16 is high and the refractive index n2 in the part corresponding to the two sides of the stripe portion 16 is low.

By changing the refractive index in steps in the lateral direction in this way, the light is guided in the lateral direction in the self-pulsation type semiconductor laser 10.

In this case, the difference Δn (=n1−n2) in the refractive indexes between the part corresponding to the stripe portion 16 and the parts corresponding to the two sides thereof is set to be not more than about 0.003 and the optical confinement in the lateral direction of the AlGaAs active layer 13 is eased.

At the time of operation of the self-pulsation type semiconductor laser 10 constituted in this way, as shown in FIG. 28, a width WP of a light waveguide region 22 becomes larger than a width WG of a gain region 21 inside the AlGaAs active layer 13. The light waveguide region 22 at the outside of the gain region 21 becomes a saturable absorbing region 23.

In this self-pulsation type semiconductor laser 10, by making the change in the refractive index in the lateral direction small, the seepage of light in the lateral direction is increased. By making the interaction between the light and the saturable absorbing region 23 inside the AlGaAs active layer 13 larger, self-pulsation is realized. For this purpose, it is necessary to secure a sufficient saturable absorbing region 23.

As explained above, the self-pulsation type semiconductor laser 10 has so-called a ridge structure as shown in FIG. 30, in which saturable absorbing regions are provided at the two sides of the light waveguide inside the active layer and made to perform the self-pulsation.

In this case, as shown in FIG. 30, when the relationship of P>G is satisfied by making the gain region inside the active layer (width thereof defined as G) created by a spread of the current as narrow as possible and conversely setting a light waveguide spot size (width thereof defined as P) relatively large, this difference acts as the saturable absorbing region and causes the self-pulsation.

This relationship is satisfied by using the refractive index difference Δn of the waveguide as an intermediate guide between an index guide of about 0.005 to 0.001 and a gain guide.

FIG. 31 is a perspective view of an example of the configuration of a gain guide-type semiconductor laser of the related art, FIG. 32 is a plan view of an example of the configuration of the gain guide-type semiconductor laser of the related art, and FIG. 33 is a sectional view of an example of the configuration of the gain guide-type semiconductor laser of the related art.

As shown in the figures, this gain guide-type semiconductor laser 30 is comprised of an n-type GaAs substrate 31 on which an n-type AlGaAs cladding layer 32, an AlGaAs active layer 33, a p-type AlGaAs cladding layer 34, and a p-type GaAs cap layer 35 are successively stacked.

On the two sides of this stripe portion 36 are formed a current narrowing layers 37 given a higher resistance by ion implantation of for example $B^+$ ions.

On the p-type GaAs cap layer 35 and the current narrowing layer 37 is provided a p-type electrode 38 such as a Ti/Pt/Au electrode.

On the other hand, on a back surface of the n-type GaAs substrate 31 is provided an n-type electrode 39 such as an AuGe/Ni/Au electrode.

In the case of this gain guide-type semiconductor laser, from a practical viewpoint, the waveguide is constituted as a tapered waveguide forming a taper with a wide stripe width at the center portion becoming narrower near the end surface as shown in FIG. 32.

Note that, in FIG. 32, L denotes the entire resonator length, l1 a taper region length, l3 a wide stripe region length at the center portion, w1 a stripe width near the end surface, and w3 a stripe width at the center portion.

In the gain guide-type semiconductor laser 30 having this configuration, at the time of operation, the current flows through the stripe portion 36 and flows into the active layer 33, but since the current narrowing layer 37 is provided, the flow of the current to the two side directions of the active layer 33 is suppressed.

As a result, a light emitting region of a predetermined width is formed and laser oscillation is carried out.

In the case of a gain guide-type semiconductor laser not provided with almost any refractive index difference Δn in the lateral direction, since vertical multimode oscillation is carried out, the relative returned light noise characteristic is good. Also, the electrostatic withstand voltage is high, therefore there is strong surge proofness.

In the case of this gain guide-type semiconductor laser, the noise level required for the semiconductor laser is about 1% of the amount of the returned light in terms of the value of the relative intensity noise (RIN) and about −120 dB to −125 dB at the time of an output of several mW, so the laser is suitable as a light source for a CD or other optical disc.

Summarizing the problems to be solved by the invention, the semiconductor lasers explained above suffered from the following problems.

Namely, a self-pulsation type semiconductor laser with a refractive index difference Δn set near 0.003 and causing self-pulsation in a lateral region Inside the active layer as mentioned above has a relatively large astigmatism difference of about 10 odd μm and changes in the beam spread angle θ// in a parallel direction of a far field pattern (FFP) due to the optical output. As a result, there is the problem that it is difficult to apply this to the optical system of an optical disc.

Further, in the case of a not illustrated index guide-type semiconductor laser, when the beam spread angle θ// in the parallel direction of the FFP is widened, it is necessary to make the waveguide mode width narrower, but the waveguide mode is usually formed to be basically constant, therefore it is necessary to make it narrower over the entire region. However, this means that the light density becomes higher. So-called hole burning (HB) is apt to occur and the COD level becomes lower, therefore there is the problem that it is hard to obtain a high output operation with a high and stable kink level.

Further, since the vertical mode becomes a single mode, it is susceptible to returned light noise. In particular, where the system is used in an optical disc, it is necessary to perform high frequency modulation of several hundred MHZ. For this reason, the structure of the optical pick-up is more complex than that with a gain guide-type semiconductor laser. Further, for the general structure of the ridge structure, at least two crystal growths becomes necessary and an electrode surface flattening process is added, so the process load is increased.

Further, in the case of a gain guide-type semiconductor laser with almost no refractive index difference Δn, a large astigmatism difference of several tens of μm and a double peak property of the direction of the beam spread angle θ// of the parallel direction of the FFP are apt to occur. Usually, it is not practical unless a tapered waveguide as shown in FIG. 32 is adopted.

However, the tapered waveguide is susceptible to loss, so it is difficult to achieve all of the goals of low noise, low astigmatism difference, and single peak FFP by suitably adjusting the taper shape. Further, in a gain guide of the ion implantation method, the control of the refractive index difference Δn is almost impossible, therefore further enhancement of the characteristic is not easy.

In order to correct a large astigmatism difference of several tens of μm and make the focus spot sufficiently small, an astigmatism difference correcting optical system such as an inclined plate glass is used, but addition of such an optical system requires additional members and adjustment costs, so is not desirable.

Further, there is also a possibility that other aberration such coma will be generated, therefore it is hard to say that this is suited to the coming age of high density optical discs.

SUMMARY OF THE INVENTION

An object of the present invention is to provide a semiconductor light emitting device resistant to returned light noise, able to excellent correct or reduce astigmatism difference, and stable in oscillation even at times of high output operation.

To attain the above object, according to a first aspect of the present invention, there is provided a semiconductor light emitting device comprising a first cladding layer of first conductivity type, an active layer formed on the first cladding layer, and a second cladding layer of a second conductivity type formed on the active layer, having a center portion of the second cladding layer forming a ridge structure, and comprising a stripe-shaped current injection structure, wherein a second ridge structure is formed on the second cladding layer at the two sides of the stripe portion formed on the second cladding layer via a ridge separation portion formed with a thickness in the stacking direction of the first cladding layer, active layer, and second cladding layer thinner than that of the ridge structure, a waveguide stripe width at the center is constant, and the width in a direction perpendicular to the stacking direction of the ridge separation portion is set so as to be different between the center portion in a resonator direction and near an end surface.

According to a second aspect of the present invention, there is provided a semiconductor light emitting device comprising a first cladding layer of a first conductivity type, an active layer formed on the first cladding layer, and a second cladding layer of a second conductivity type formed on the active layer, having a center portion of the second cladding layer forming a ridge structure, and comprising a stripe-shaped current injection structure, wherein the second ridge structure is formed on the second cladding layer on at the two sides of the stripe portion formed on the second cladding layer via a ridge separation portion formed with a thickness of the stacking direction of the first cladding layer, active layer, and second cladding layer thinner than that of the ridge structure, the waveguide stripe width at the center is constant, and the width in the direction perpendicular to the stacking direction of the ridge separation portion is set so as to be narrow at the center portion in the resonator direction and broader than that at the center portion near the end surface.

According to a third aspect of the present invention, there is provided a semiconductor light emitting device comprising a first cladding layer of a first conductivity type, an active layer formed on the first cladding layer, and a second cladding layer of a second conductivity type formed on the active layer, having a center portion of the second cladding layer forming a ridge structure, and comprising a stripe-shaped current injection structure, wherein the second ridge structure is formed on the second cladding layer at the two sides of the stripe portion formed on the second cladding layer via the ridge separation portion formed with a thickness in the stacking direction of the first cladding layer, active layer, and second cladding layer thinner than that of the ridge structure, the waveguide stripe width at the center is constant, and the width in the direction perpendicular to the stacking direction of the ridge separation portion is set so as to be wide at the center portion in the resonator direction and narrower than that at the center portion near the end surface.

Preferably, in the above aspects of the present invention, at least a recessed portion of the second cladding layer forming the ridge separation portion has a current narrowing structure in which a current narrowing layer of the first conductivity type is buried.

Further, preferably, an insulating film is formed in at least one part of an upper surface of the second cladding layer except a top surface of the second cladding layer forming the ridge structure at the center portion.

Still further, preferably, a current injection use cap layer is formed on the top surface of the second cladding layer forming the ridge structure at the center portion and in one part of the top surface of the second cladding layer forming the second ridge structure.

According to a fourth aspect of the present invention, there is provide a laser semiconductor light emitting device comprising a first cladding layer of a first conductivity type, an active layer formed on the first cladding layer, and a second cladding layer of a second conductivity type formed on the active layer, having a center portion of the second cladding layer forming a ridge structure, and comprising a stripe-shaped current injection structure, wherein a waveguide mechanism comprises an index guide area formed at one of a position near a light emitting front end surface for emitting a laser beam and a position near a rear end surface and having a built-in refractive index difference for the waveguide in a lateral direction perpendicular to a resonator length direction and a gain guide area formed in the region except the index guide area and not having the built-in refractive index difference.

In this aspect of the present invention, preferably, in the index guide area, the index guide mechanism is constituted so that the refractive index difference is gradually increased over a range from a connection portion with the gain guide region to the light emitting front end surface.

Further, preferably, the index guide mechanism is constituted by grooves formed on the two sides of the stripe portion and formed so that the groove width thereof gradually becomes larger over a range from the connection portion with the gain guide area to the light emitting front end surface.

Alternatively, preferably, the index guide mechanism is constituted by grooves formed on the two sides of the stripe portion and formed so that a distance from a bottom surface of the groove to the active layer gradually becomes smaller over the range from the connection portion with the gain guide area to the light emitting front end surface.

Alternatively, preferably, the index guide mechanism is constituted by grooves formed on the two sides of the stripe portion and formed so that the groove width gradually becomes larger over the range from the connection portion with the gain guide area to the light emitting front end surface and then the distance from the bottom surface of the groove to the active layer gradually becomes smaller over the range from the connection portion with the gain guide area to the light emitting front end surface.

Further, preferably, the stripe portion forms a taper shape with a width which is wide at the center portion and becomes narrow near the end surface.

Alternatively, preferably, the stripe portion forms a schematically uniform straight shape over the entire width thereof.

According to a fifth aspect of the present invention, there is provided a semiconductor light emitting device comprising a first cladding layer of a first conductivity type, an active layer formed on the first cladding layer, and a second cladding layer of a second conductivity type formed on the active layer and comprising a stripe-shaped current injection structure, wherein a current noninjection portion is formed at the center region of the stripe portion.

According to a sixth aspect of the present invention, there is provided a semiconductor light emitting device comprising a first cladding layer of a first conductivity type, an active layer formed on the first cladding layer, and a second cladding layer of a second conductivity type formed on the active layer and comprising a stripe-shaped current injection structure, further comprising layers which absorb the light at positions asymmetrical with respect to the active layer in an optical confinement mode in the stacking direction of the first cladding layer, active layer, and second cladding layer.

Preferably, in this aspect of the invention, preferably the layers absorbing the light are first and second absorption layers formed at positions asymmetrical with respect to the active layers in the first cladding layer of first conductivity type and the second cladding layer of second conductivity type.

Further, preferably, provision is made of a semiconductor substrate having the first cladding layer formed in a front surface region and a cap layer formed on the second cladding layer, and wherein the thicknesses of the first and second cladding layers are set to values so that at least the skirts of the optical confinement mode in the vertical direction reaches the semiconductor substrate and the cap layer, and the semiconductor substrate and the cap layer are the layers absorbing the light.

According to the present invention, for example, in the case of a self-pulsation type semiconductor laser in which the waveguide stripe width at the center is constant and the width in the direction perpendicular to the stacking direction of the ridge separation portion are set narrow at the center portion in the resonator direction and broader than that at the center portion near the end surface, the spread of the light in the lateral direction becomes larger than the stripe width of the second cladding layer. Namely, at the center waveguide portion. the light spreads in the lateral direction, but the current remains narrow as it is, therefore a saturable absorbing region effective for pulsation is sufficiently obtained. By this, a state where the light is focused like with a so-called index guide and the pulsation is no longer generated does not occur, and the pulsation is stably continuously generated.

On the other hand, near the end surface, the light mode is focused at the center and the effective refractive index difference $\Delta n$ becomes larger, therefore the result becomes close to that of an index-type waveguide. By this, the astigmatism difference is corrected, and the beam spread angle $\theta//$ in the parallel direction of FFP is spread.

Further, in the case of a semiconductor laser in which the waveguide stripe width at the center is constant and the width in the direction perpendicular to the stacking direction of the ridge separation portion is set narrow at the center portion in the resonator direction and broader than that at the center portion near the end surface, the waveguide mode becomes narrow at the center portion and becomes wide near the end surface.

In a material causing large deterioration at the end surface or a high output laser having a high end surface optical density, it is necessary to lower the optical density of the end surface for securing the reliability thereof.

For this reason, a flaring structure in which the stripe width is increased near the end surface has been used, but it becomes possible to achieve an effect equivalent to this while keeping the shape of the straight stripe as it is by the present structure.

Further, according to the present invention, since there is a waveguide mechanism in which the index guide area is connected to the gain guide area, the astigmatism difference is reduced while making good use of the vertical mode property of the gain guide, that is, while securing the low noise characteristic strong against the returned light as it is, and the focus spot system becomes small.

Further, since the invention is designed so that the refractive index difference is gradually increased over the range from the connection portion with the gain guide area to the light emitting front end surface in the index guide area, the waveguide surface of the gain guide area, that is, the curved wave surface, gradually changes to a plane wave surface in the index guide area. The wave surface is gently changed, and the astigmatism difference is corrected inside the laser while reducing the energy loss.

Further, according to the present invention, in a semiconductor laser in which the current noninjection portion is formed at the center region of the stripe portion, the waveguide loss becomes large at the center region of the stripe portion in which the current noninjection portion is formed.

Accordingly, since the waveguide surface will be curved with respect to the direction of advance of light, a delay occurs between the stripe center portion having a large loss and the two end portions of the stripe.

Further, in a semiconductor laser provided with light absorption layers, the wave surface in the vertical direction is corrected from a recessed wave surface to a convex wave surface.

BRIEF DESCRIPTION OF THE DRAWINGS

These and other objects and other features of the present invention will become more apparent from the following description of the preferred embodiments given with reference to the accompanying drawings, in which.

DESCRIPTION OF THE PREFERRED EMBODIMENTS

First Embodiment

Figure 1:
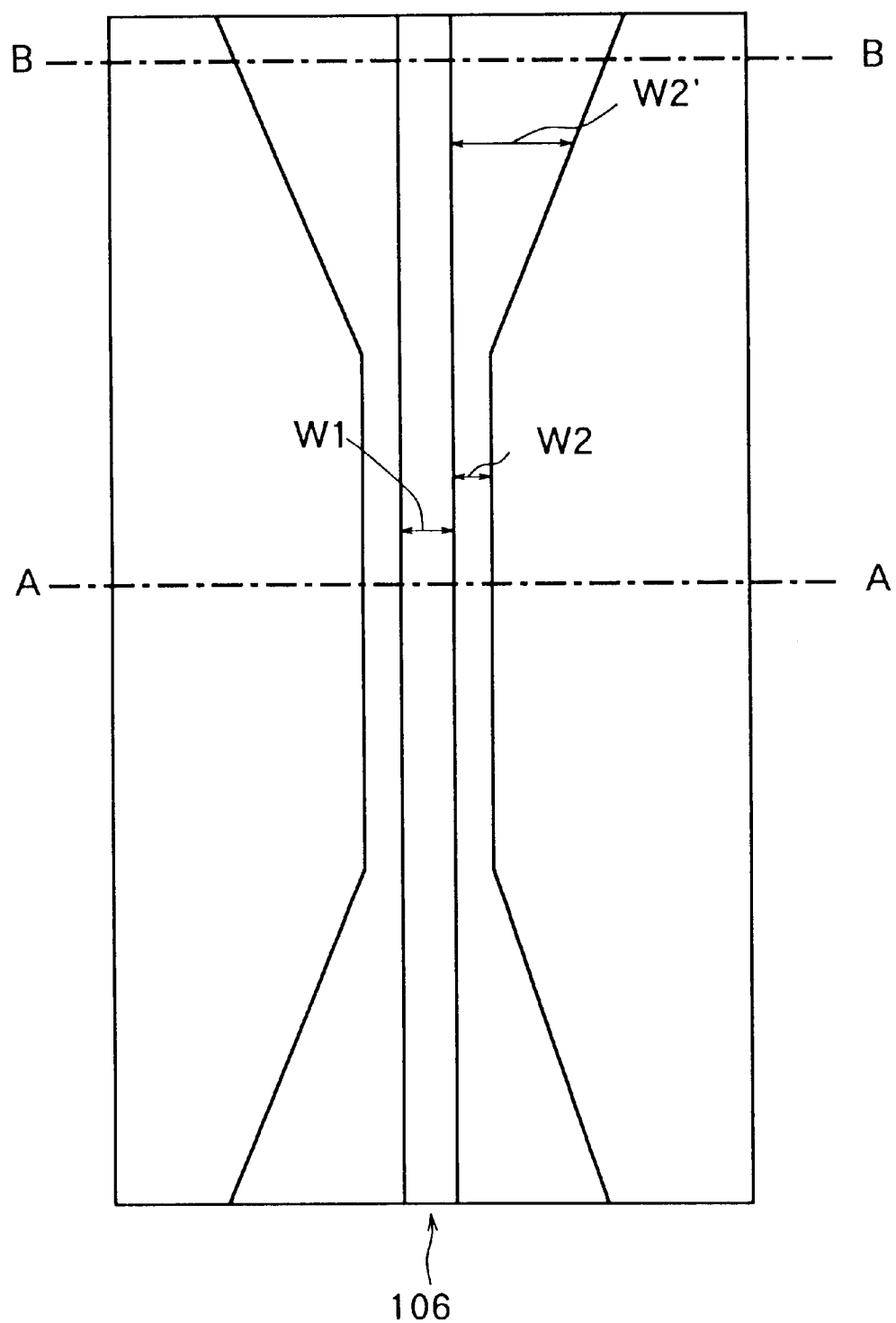
FIG. 1 is a plan view of a semiconductor laser according to a first embodiment of the present invention.
Figure 2:
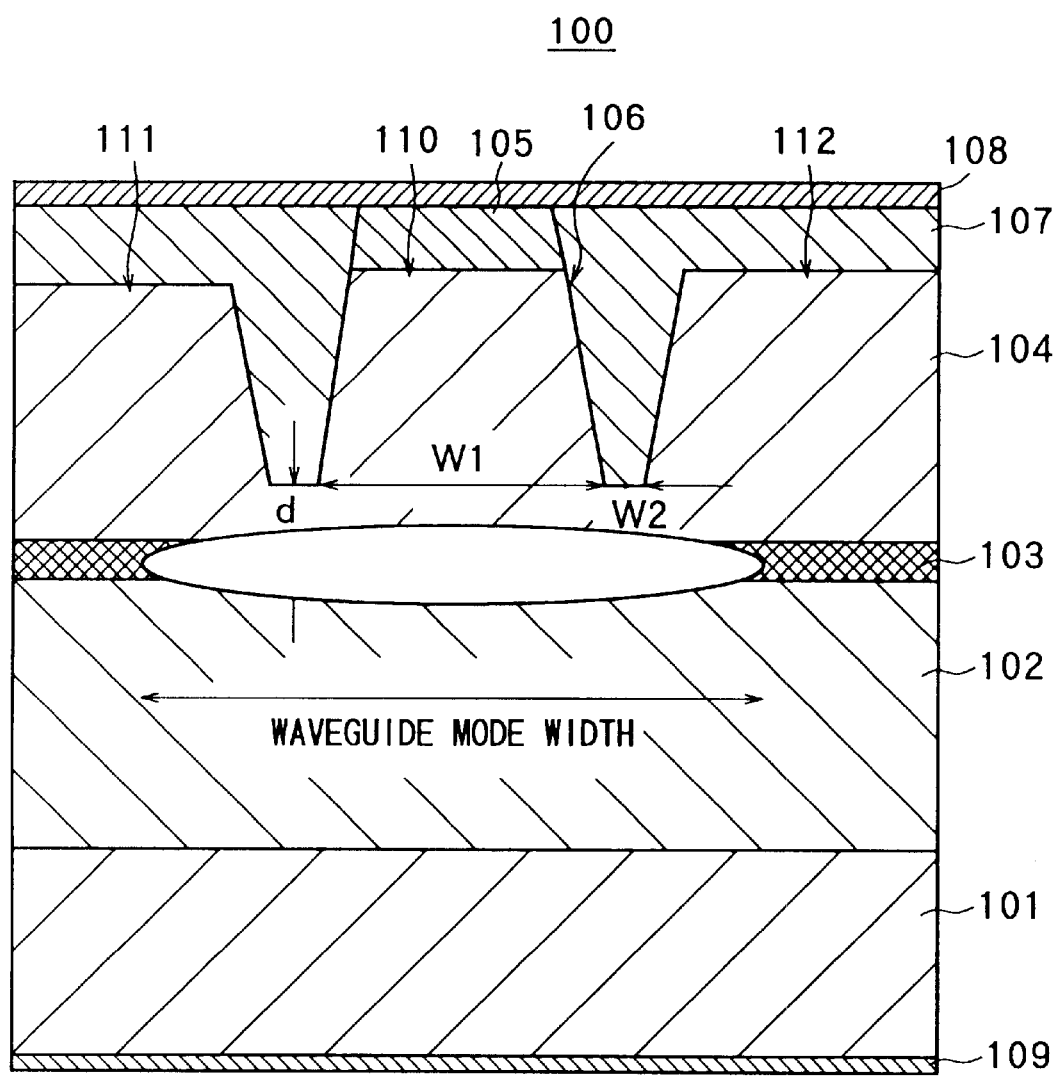
FIG. 2 is a sectional view taken along a line A—A in FIG. 1.
Figure 3:
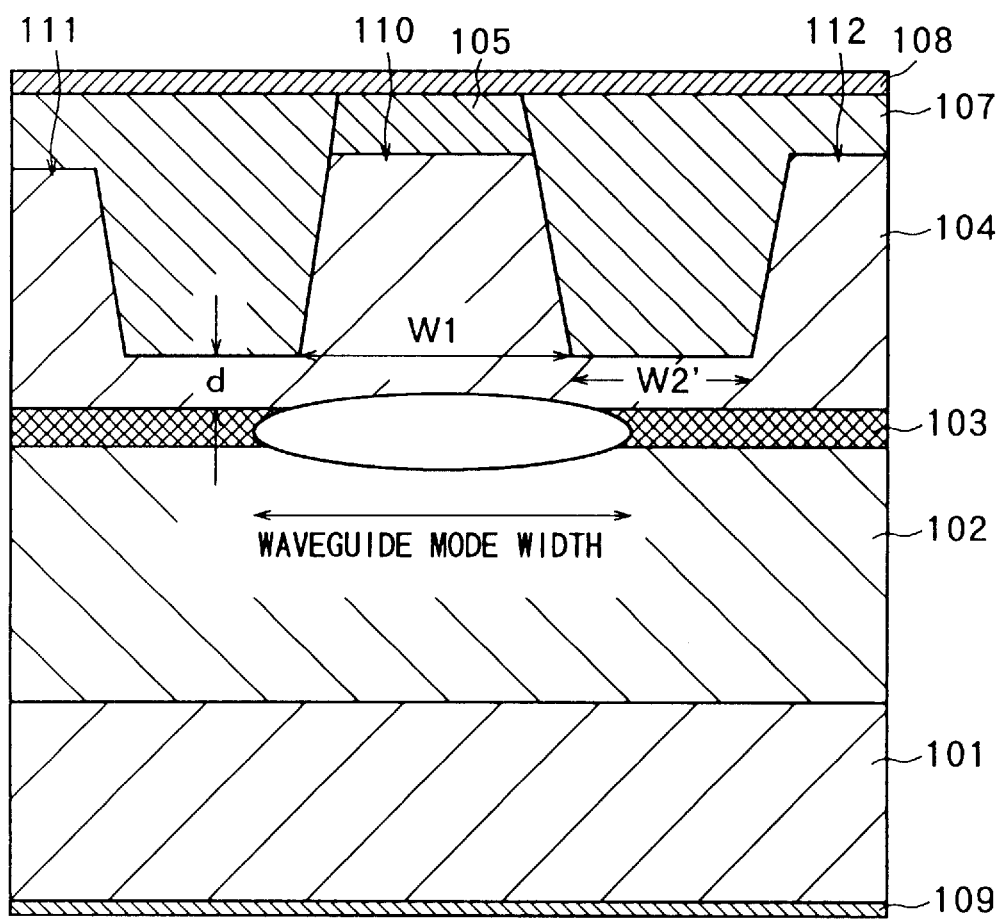
FIG. 3 is a sectional view taken along a line B—B in FIG. 1.

FIG. 1 is a plan view of a semiconductor laser according to a first embodiment of the present invention, FIG. 2 is a sectional view taken along a line A—A in FIG. 1, and FIG. 3 is a sectional view taken along a line B—B in FIG. 1.

Note that, here, a case is shown where a self-pulsation type semiconductor laser in which the saturable absorbing regions are formed at the two sides of the active layer is constituted inside a laser resonator by an AlGaAs-based material.

As shown in the figure, this self-pulsation type semiconductor laser 100 is comprised of an n-type (first conductivity type) GaAs substrate 101 on which an n-type AlGaAs cladding layer (first cladding layer) 102, an AlGaAs active layer 103, a p-type (second conductivity-type) AlGaAs cladding layer (second cladding layer) 104, and a p-type GaAs cap layer 105 are successively stacked.

The upper layer of the p-type AlGaAs cladding layer 104 and the p-type GaAs cap layer 105 have mesa-type stripe shapes extending in one direction.

Namely, a stripe portion 106 is constituted by an upper layer of the p-type AlGaAs cladding layer 104 and the p-type GaAs cap layer 105.

n-type GaAs current narrowing layers 107 are buried at the two side parts of this stripe portion 106. The current narrowing structure is formed by this.

On the p-type GaAs cap layer 105 and the n-type GaAs current narrowing layer 107 is provided a p-side electrode 108, for example, a Ti/Pt/Au electrode.

On the other hand, on the back surface of the n-type GaAs substrate 101 is provided an n-side electrode 109, for example, an AuGe/Ni/Au electrode.

The usual ridge structure has a single peak structure in which only the center waveguide part rises up, but as shown in FIG. 1 to FIG. 3, the self-pulsation type semiconductor laser 100 is constituted as a so-called W-type ridge shape having a double peak structure in which two portions rise up.

Further, it is constituted so that the waveguide stripe width at the center of the stripe portion 106 is constant, the width of the cladding layer recessed portion between ridges, that is, the width of the deepest part buried in the p-type AlGaAs cladding layer 104 of the current narrowing layer 107, is not constant, but nonuniform having a narrower part (in the first embodiment, the resonator center portion is formed narrow).

Specifically, in the self-pulsation type semiconductor laser 100, the stripe width W1 of the mesa-shape bottom portion is set to 4 µm or less, the width of the recessed portion between ridges (width of the ridge separation portion; below, referred to as the ridge separation width) W2 is set to for example 5 µm or less at the center portion of the stripe portion 106 (resonator center portion), and the ridge separation width W2' near the end surface side is set broader than the ridge separation width W2 at the center portion.

When the ridge separation width W2 at the center portion of the stripe portion 106 is set to about 5 µm or less, it becomes almost equivalent to the stripe width W1 of the center ridge portion 110 (about 4 µm, note that, in FIG. 2 and FIG. 3, for clarifying the description of the waveguide mode width etc., W1 is shown larger than W2) and the skirts of the waveguide mode start to act upon the refractive index portion of the ridge portions 111 and 112 on the two sides.

When such a state is exhibited, the effective refractive index difference Δn becomes small and the waveguide mode tends to become broader.

In this way, the control of the refractive index difference Δn becomes possible by the control of the ridge separation width W2—which can be formed by an easy etching process. The ability to freely change the waveguide state in the resonator direction makes it possible to change the waveguide mode without changing the shape of the center portion of the stripe portion 106, that is, while keeping the current distribution narrow and uniform as it is.

Further, in order to stably generate the pulsation, the thickness d between the AlGaAs active layer 103 and the current narrowing layer 107 of the p-type AlGaAs cladding layer 104 is set as for example d ≦400 nm, preferably d ≦350 nm or so that the current does not spread in the lateral direction of the active layer, the light spot is expanded, the difference therebetween is made larger, and a wide saturable absorbing region is secured.

Further, the refractive index difference Δn (=n1−n2) between the part corresponding to the stripe portion 106 and the part corresponding to the two sides thereof is set to about 0.003 or less and the optical confinement in the lateral direction of the AlGaAs active layer 103 is eased.

The self-pulsation type semiconductor laser 100 is produced as follows.

First, on the n-type GaAs substrate 101, the n-type AlGaAs cladding layer 102, AlGaAs active layer 103, p-type AlGaAs cladding layer 104, and p-type GaAs cap layer 105 are successively grown by for example a metal organic chemical vapor deposition (MOCVD) process.

Next, a resist pattern of a predetermined shape is formed on the p-type GaAs cap layer 106, then this resist pattern is used as an etching mask to etch the p-type GaAs cap layer 105 and the p-type AlGaAs cladding layer 104 up to a predetermined depth of the thickness direction of the p-type AlGaAs cladding layer 104 by a wet etching process using a bromic acid-based etching liquid or the like so that the center ridge portion 110 and the two side ridge portions (second ridge structures) 111, 112 are constituted and the width (ridge separation width) of the region in which the thickness of the p-type AlGaAs cladding layer 104 is thin between the two side ridge portions 111, 112 and the center ridge portion 110 is narrow at the center portion, but becomes wide near the end surface.

Due to this, the upper layer portion of the p-type AlGaAs cladding layer 104 and the p-type GaAs cap layer 105 are patterned to the stripe shape extended in one direction. Namely, the stripe portion 106 is formed.

Next, by using the resist pattern used as the etching mask as a growth mask, the n-type GaAs current narrowing layers 107 are formed at the two side parts of the stripe portion 106.

Next, the resist pattern used as the growth mask is removed, then the p-side electrode 108 is formed on the p-type GaAs cap layer 105 and the n-type GaAs current narrowing layer 107 and the n-side electrode 109 is formed on the back surface of the n-type GaAs substrate 101.

The self-pulsation type semiconductor laser 100 finishes being manufactured by the above.

Next, the operation by the above configuration will be explained.

At the time of operation of the self-pulsation type semiconductor laser 100, the current flows through the stripe portion 106, but in this case, the thickness d between the AlGaAs active layer 103 and the current narrowing layer 107 of the p-type AlGaAs cladding layer 104 is set to a sufficiently small value of 400 nm or less, so the spread of the current in the lateral direction is suppressed to about the stripe width W1 of the p-type AlGaAs cladding layer 104.

On the other hand, the inter-ridge recessed portion width (ridge separation width) W2 is set to for example 5 µm or less at the center portion of the stripe portion 106 (resonator center portion), the ridge separation width W2' near the end surface side is set broader than the ridge separation width W2 at the center portion, the refractive index difference Δn between the part corresponding to the stripe portion 106 and the part corresponding to the two sides thereof is set to about 0.003 or less, and the optical confinement in the lateral direction of the AlGaAs active layer 103 is eased.

Accordingly, in the center waveguide portion, the spread of the light in the lateral direction becomes larger than the stripe width W1 of the p-type AlGaAs cladding layer 104.

Namely, in the center waveguide portion, the light spreads in the lateral direction, but the current remains narrow as it is, so a sufficient saturable absorbing region effective for the pulsation can be obtained. Due to this, the state where the light is focused like a so-called index guide and pulsation is no longer generated does not occur and pulsation is stably continuously generated.

On the other hand, near the end surface, the light mode is focused to the center and the effective refractive index difference Δn becomes large, therefore becomes close to an index-type waveguide. Namely, since it becomes close to a plane wave waveguide, astigmatism difference becomes hard to occur, the astigmatism difference is corrected, and the beam spread angle θ// of the parallel direction of the FFP is spread.

As explained above, according to the first embodiment, in the self-pulsation type semiconductor laser 100, the waveguide stripe width of the center of the stripe portion 106 is constant, the inter-ridge recessed portion width (ridge separation width) W2 is set narrow at the center portion of the stripe portion 106 (resonator c enter portion), the ridge separation width W2' near the end surface side is set broader than the ridge separation width W2 at the center portion, the refractive index difference Δn between the part corresponding to the stripe portion 106 and the part corresponding to the two sides thereof is set to be about 0.003 or less, and the optical confinement in the lateral direction of the AlGaAs active layer 103 is eased, therefore the waveguide mode of the stripe center portion is laterally expanded and, in addition, the current can be held in the narrow region.

Accordingly, it is possible to form a saturable absorbing region in a lateral region inside the active layer and stably induce the pulsation.

Concerning the astigmatism difference, t he effective refractive index difference Δn near the end surface is made large enabling use as an index guide-like waveguide, therefore the astigmatism difference can be brought close to zero. Further, fixing the mode at this end surface enables suppression of the change of the beam spread angle θ// of the parallel direction of the FFP by the output.

As a result, there are the advantages that the laser can be applied to an optical system for an optical disc and the compatibility is high.

Further, the laser can be formed by a very easy process similar to the usual process.

Note that, in the first embodiment, the explanation was made by taking as an example an AlGaAs/GaAs-based self-pulsation type semiconductor laser, but needless to say the present invention can be applied to various lasers such as AlGaInP/GaInP, AlGaN/InGaN, and ZnMgSSe/ZnS lasers.

Second Embodiment

Figure 4:
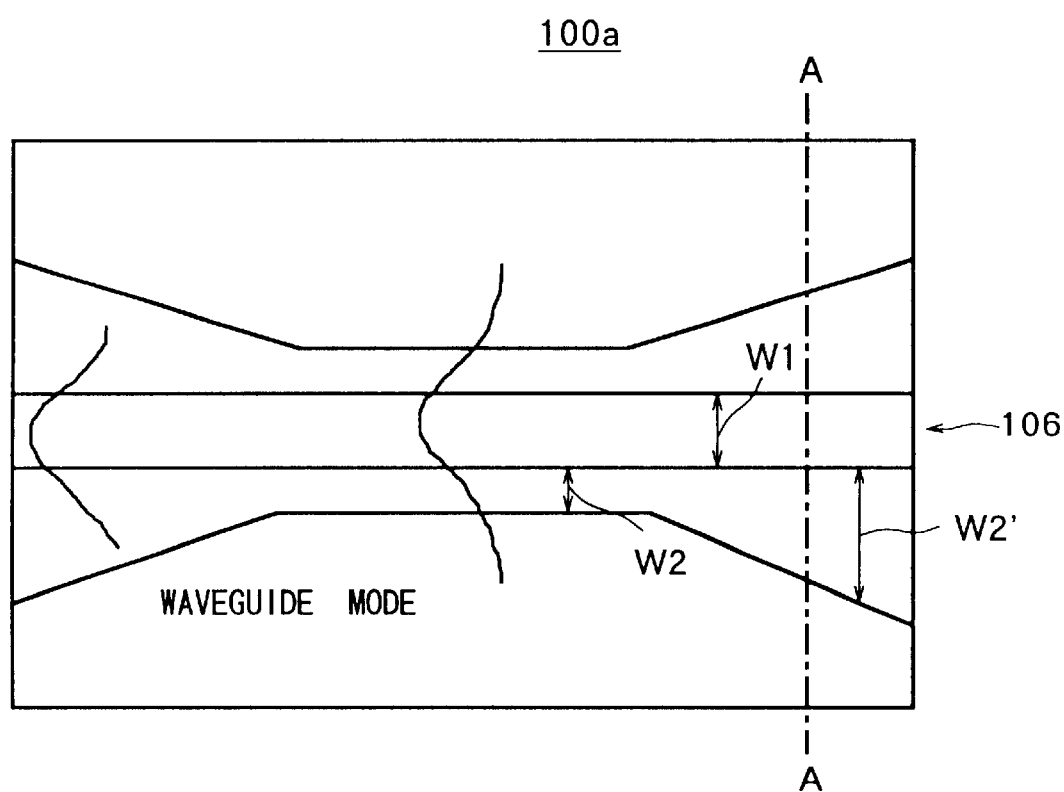
FIG. 4 is a sectional view of a semiconductor laser according to a second embodiment of the present invention.
Figure 5:
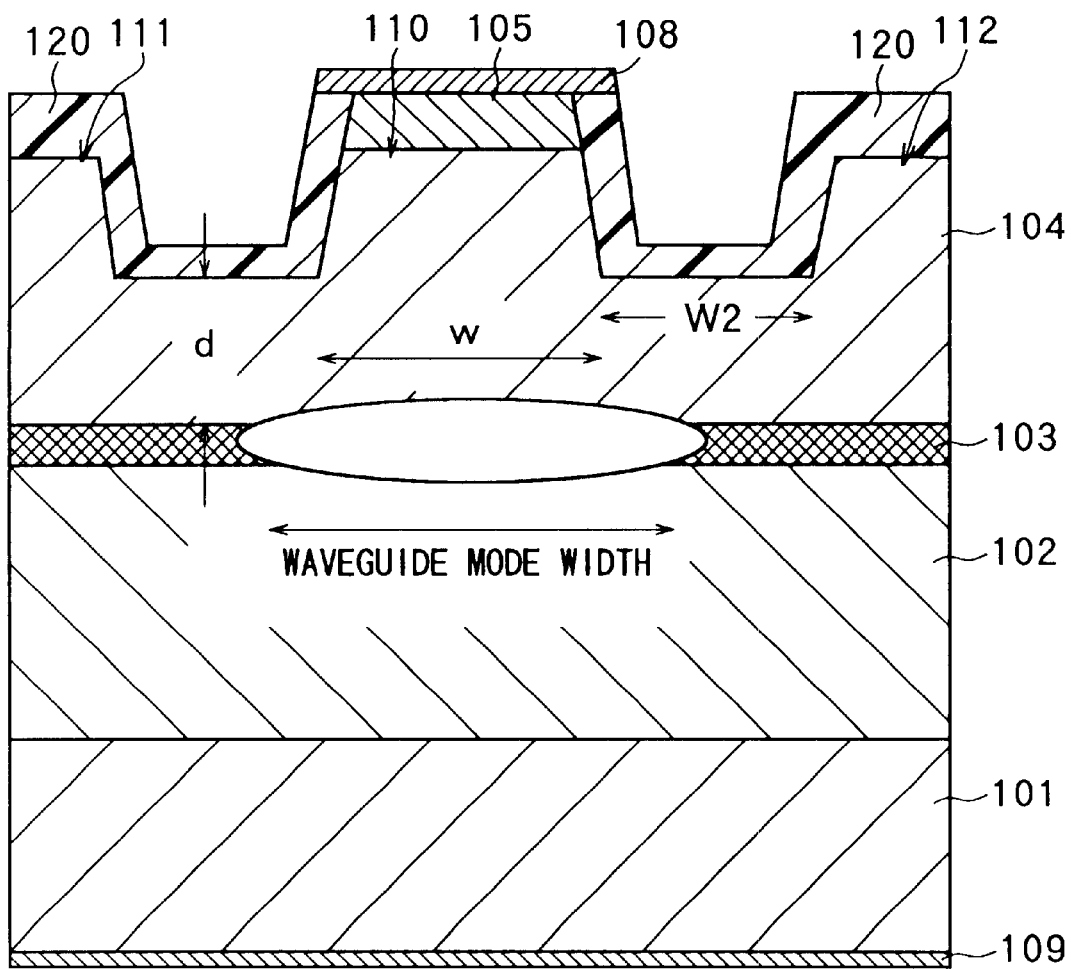
FIG. 5 is a sectional view taken along the line A—A in FIG. 4.

FIG. 4 is a plan view of a semiconductor laser according to a second embodiment of the present invention, and FIG. 5 is a sectional view taken along a line A—A in FIG. 4.

The difference of the second embodiment from the first embodiment resides in that, in place of forming the current narrowing layer as a buried layer, an insulating film 120, for example $SiO_2$ or $Si_3N_4$, is stacked over a range from a groove portion constituting the ridge separation portion having the W-ridge shape formed by etching, that is, a region in which the thickness of the p-type AlGaAs cladding layer 104 is thin between the two side ridge portions 111 and 112 and the ridge portion 110 at the center and the side wall part thereof to the top surface of the two side cladding layers 104.

In this case, there is the advantage that epitaxial growth can be carried out at one time and the advantage that a real index guide type with little loss can be formed.

In this case, the formation of a waveguide by mesa-type etching without the use of ion implantation etc. is easy and convenient in terms of the process. Further, the built-in small (weak) refractive index difference Δn can be controlled by the thickness d between the insulating film 120 of the p-type AlGaAs cladding layer 104 and the active layer 103, therefore improvement of the characteristics becomes possible.

For example, by giving a slightly larger refractive index difference than that by the first embodiment, it becomes possible to reduce the threshold current, reduce the astigmatism difference, generate pulsation, etc.

Third Embodiment

Figure 6:
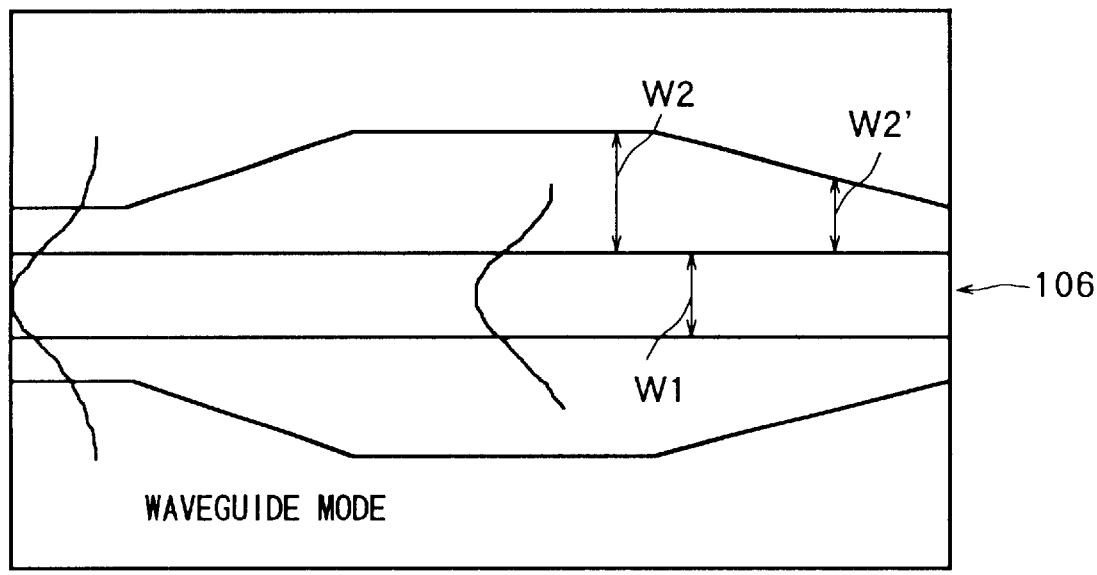
FIG. 6 is a sectional view of a semiconductor laser according to a third embodiment of the present invention.

FIG. 6 is a plan view of a semiconductor laser according to a third embodiment of the present invention.

The difference of the third embodiment from the first and second embodiments resides in that a modulation structure of a shape reverse to that of so-called axial direction modulation is adopted.

Specifically, it becomes a structure in which the waveguide stripe width of the center of the stripe portion 106 is constant, but the inter-ridge recessed portion width (ridge separation width) is made wide at the stripe center portion (resonator center portion), but made narrow near the end surface.

In the case of such a structure, the waveguide mode becomes narrow at the center portion and wide near the end surface as shown in the figure.

In a material causing a large deterioration at the end surface and a high output laser having a high end surface optical density, it is necessary to lower the optical density of the end surface for securing reliability.

For this reason, a so-called flaring structure in which the stripe width is expanded near the end surface has been used, but it becomes possible to obtain an effect equivalent to this while keeping the shape of the straight stripe as it is by the present structure.

Fourth Embodiment

Figure 7:
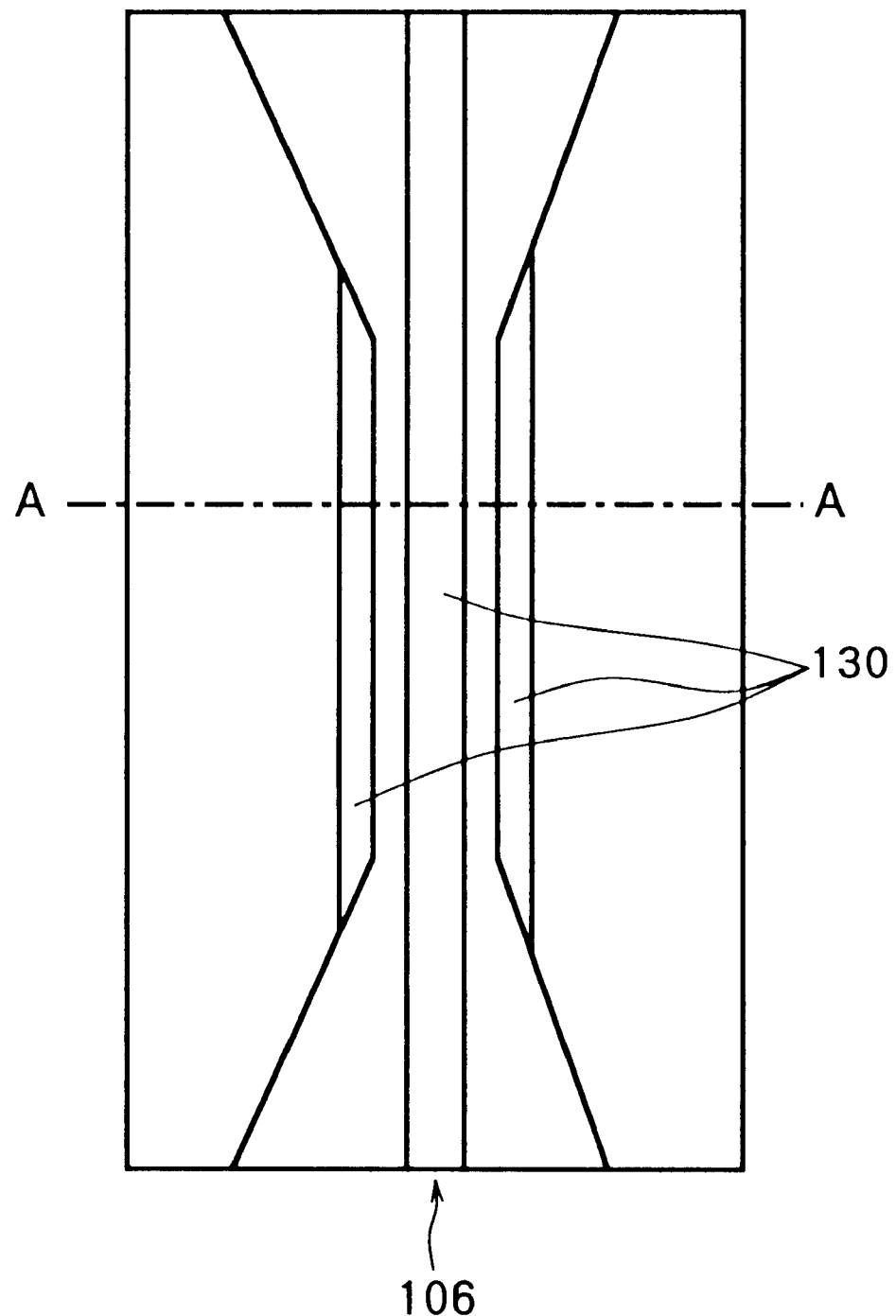
FIG. 7 is a plan view of a semiconductor laser according to a fourth embodiment of the present invention.
Figure 8:
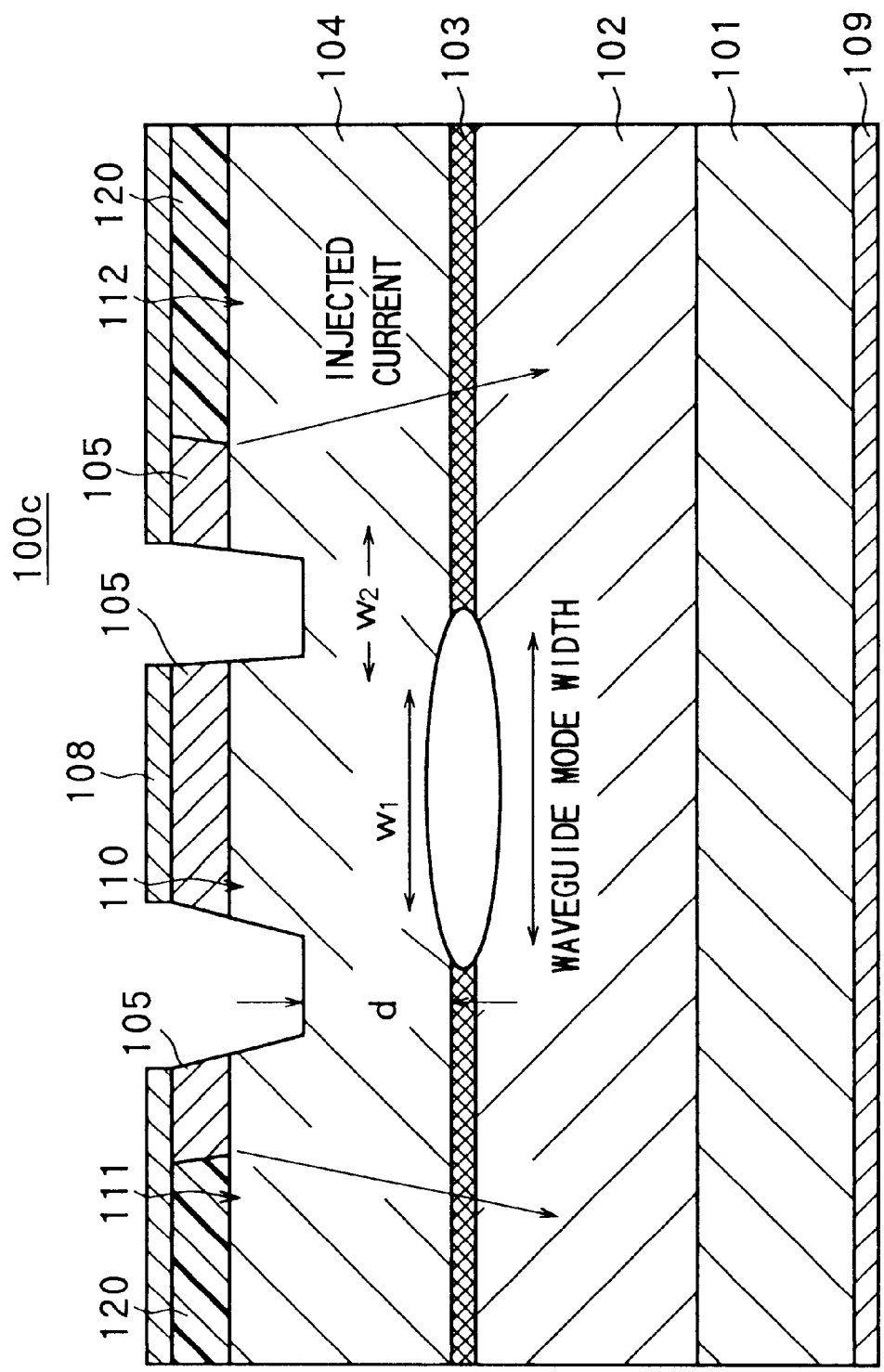
FIG. 8 is a sectional view taken along a line A—A in FIG. 7.

FIG. 7 is a plan view of a semiconductor laser according to a fourth embodiment of the present invention, and FIG. 8 is a sectional view taken along a line A—A in FIG. 7.

The difference of the fourth embodiment from the second embodiment resides in that an insulating film 120 such as $SiO_2$ or $Si_3N_4$ is formed at an outside portion at the two side ridge portions 111 and 112, the insulating film is not formed over the range from the groove portion constituting the ridge separation portion having the W-ridge shape formed by etching, that is, the region in which the thickness of the p-type AlGaAs cladding layer 104 is thin between the two side ridge portions 111 and 112 and the ridge portion 110 at the center and the side wall part thereof to one part of the top surface of the two side cladding layers 104, the cap layer (contact layer) 105 is formed in one part of the top surface of the cladding layer 104, and a so-called current injection portion 130 is provided at not only the stripe portion 106, but also the W-ridge two side portions as shown in FIG. 7.

The fourth embodiment is based on a concept completely opposite to that of pulsation, but making the gain as uniform as possible in the region of the optical mode is advantageous for suppressing the hole burning (HB) and stabilization of the FFP.

Further, a structure having a wide gain region as in the fourth embodiment is significant for further reducing the waveguide loss and raising the differentiation efficiency.

The present structure is a laser that dares to pass an invalid current, therefore the threshold current becomes high, but there is the advantage that the effects of for example the improvement of the differentiation efficiency and the stabilization of the FFP can be obtained.

Note that the structure explained above can be generally applied to all types of semiconductor lasers. Further, it is not necessary to make the modulation structure symmetrical between front and rear of the resonator. Also, it is not necessary to make the modulation structure symmetrical at the two sides too. An effect similar to that mentioned above can be obtained even in such an asymmetrical type.

Particularly, in a laser using an OFF angle substrate which is frequently used in red system lasers, the ridge shape becomes asymmetrical, therefore there is a case where it is effective if the modulation structure is made asymmetrical corresponding to this.

Fifth Embodiment

Figure 9:
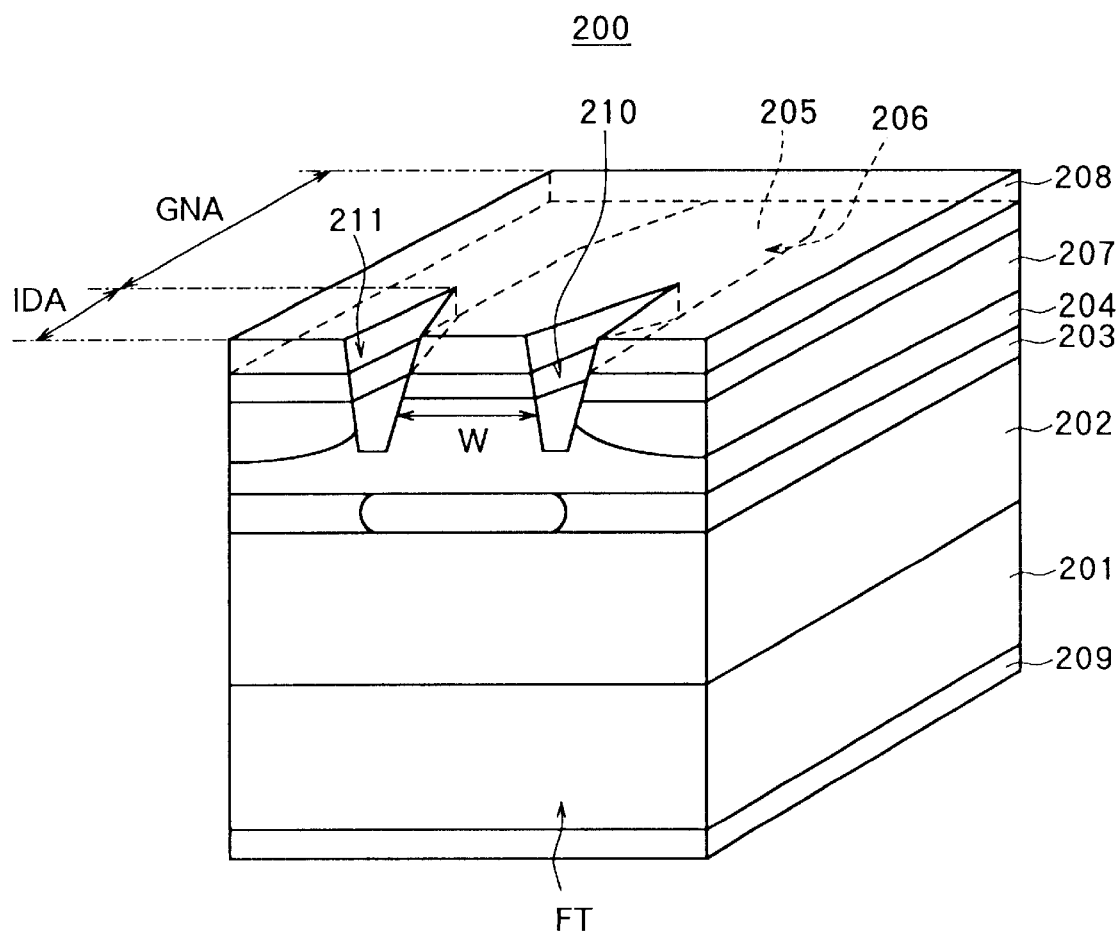
FIG. 9 is a perspective view of a semiconductor laser according to a fifth embodiment of the present invention.
Figure 10:
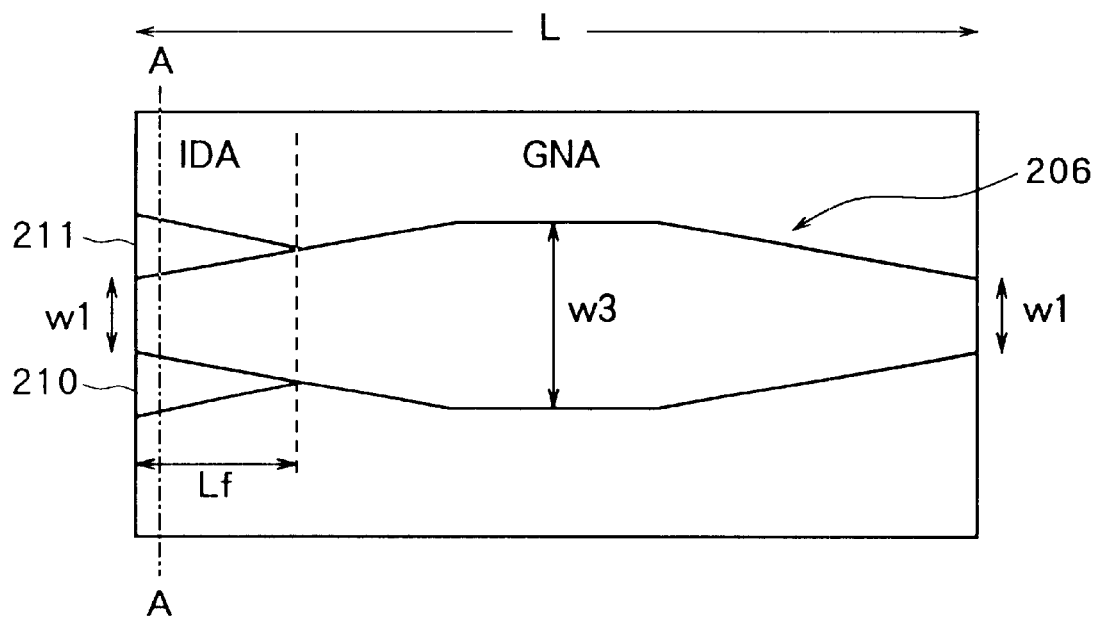
FIG. 10 is a plan view of a semiconductor laser according to a fifth embodiment of the present invention.
Figure 11:
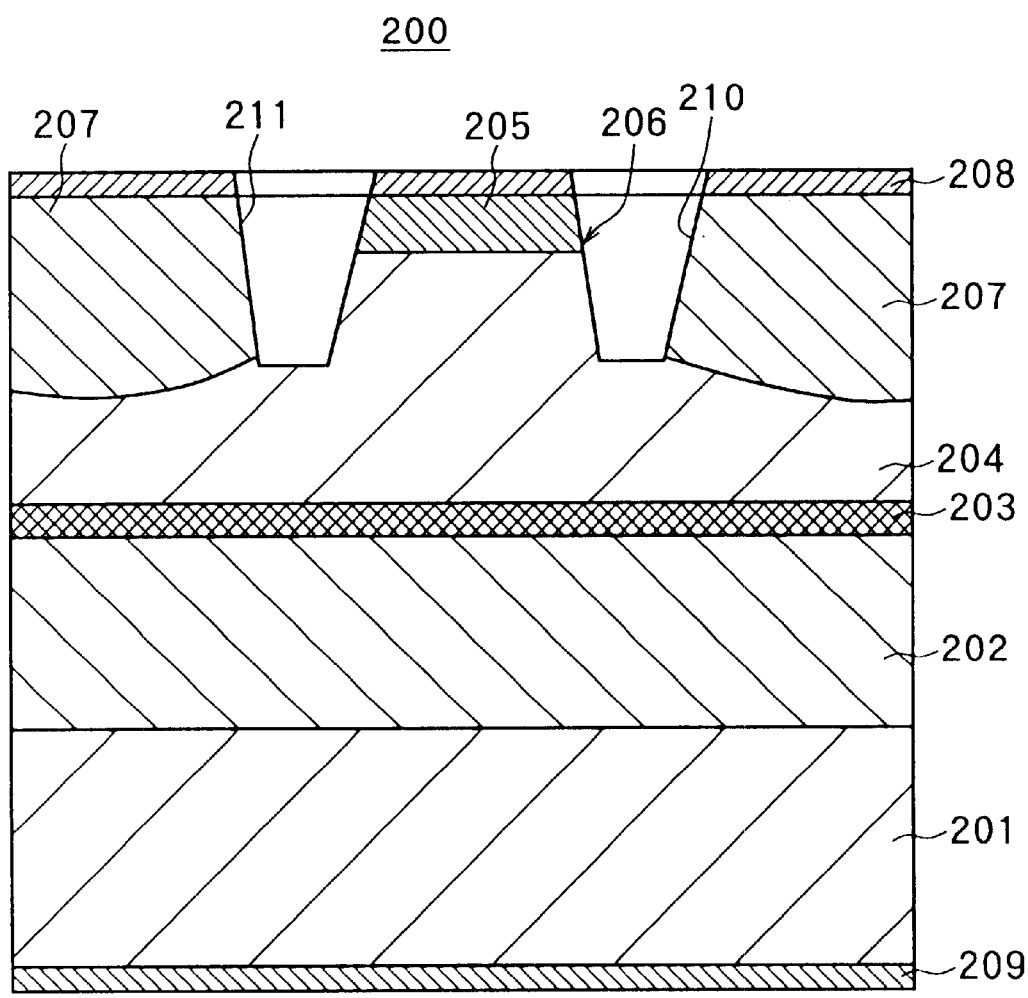
FIG. 11 is a sectional view taken along a line A—A in FIG. 10.

FIG. 9 is a perspective view of a semiconductor laser according to a fifth embodiment of the present invention, FIG. 10 is a plan view of a semiconductor laser according to the fifth embodiment of the present invention, and FIG. 11 is a sectional view taken along a line A—A in FIG. 10.

Note that, here, the structure of a so-called taper stripe-type gain guide-type semiconductor laser, where the stripe portion not having the refractive index difference in the waveguide mechanism has a tapered shape, in which the portion near the light emitting front end surface of the semiconductor laser is made an index guide structure by an AlGaAs-based material is shown.

As shown in the figures, this gain guide-type semiconductor laser 200 is comprised of an n-type GaAs substrate 201 on which an n-type AlGaAs cladding layer 202, AlGaAs active layer 203, p-type AlGaAs cladding layer 204, and p-type GaAs cap layer 205 are successively stacked.

This semiconductor laser has a stripe portion 206 extending in one direction.

At the two side parts of this stripe portion 206, a current narrowing layer 207 is formed with a high resistance by ion implantation of for example $B^+$ ions.

On the p-type GaAs cap layer 205 and the current narrowing layer 207 is provided a p-side electrode 208 such as a Ti/Pt/Au electrode.

On the other hand, on the back surface of the n-type GaAs substrate 201 is provided an n-side electrode 209 such as an AuGe/Ni/Au electrode.

Note that, the ratios of the compounds of the n-type AlGaAs cladding layer 202, AlGaAs active layer 203, and p-type AlGaAs cladding layer 204 parts in the semiconductor laser 200 according to the fifth embodiment are set so as to become for example $Al_{0.5}Ga_{0.5}As$ for the n-type cladding layer 202 and the p-type cladding layer 204 and $Al_{0.12}Ga_{0.88}As$ for the active layer 203.

Further, in the case of the semiconductor laser 200, the basic laser structure is mainly that of a gain guide-type semiconductor laser, therefore the waveguide is constituted as a tapered waveguide forming a taper where the stripe width becomes wide at the center portion, but becomes narrow near the end surface as shown in FIG. 10.

Note that, in FIG. 10, L denotes the entire resonator length, w1 the stripe width near the end surface, and w3 the stripe width of the center portion.

In the present semiconductor laser 200, in order to reduce the astigmatism difference characteristic of the index guide to within several μm while making good use of the vertical mode property characteristic of the gain guide, wedge-type grooves 210 and 211 are formed at the two sides of the stripe portion 206 near the front end surface (light emitting end surface) FT and the index guide area IDA is constituted.

Namely, the waveguide mechanism in the present semiconductor laser 200 is constituted by the index guide area IDA near the front end surface and a gain guide area GNA which is connected to this and reaches a rear end surface RT.

In this way, the waveguide mechanism in the fifth embodiment is structured that the index guide is connected (added) to the semiconductor laser having a gain guide structure near the front end surface, but when the two are simply connected, it becomes hard to smoothly transfer energy at the connection portion between the gain guide and the index guide with their different characteristics and loss such as reflection or scattering occurs.

Therefore, in the waveguide mechanism in the fifth embodiment, the ridge structure of the index guide area IDA is constituted as wedge-type grooves so as to smoothly connect the gain guide and the index guide with their different characteristics.

Below, a detailed explanation will be made of this structure including the connection mechanism.

Figure 12:
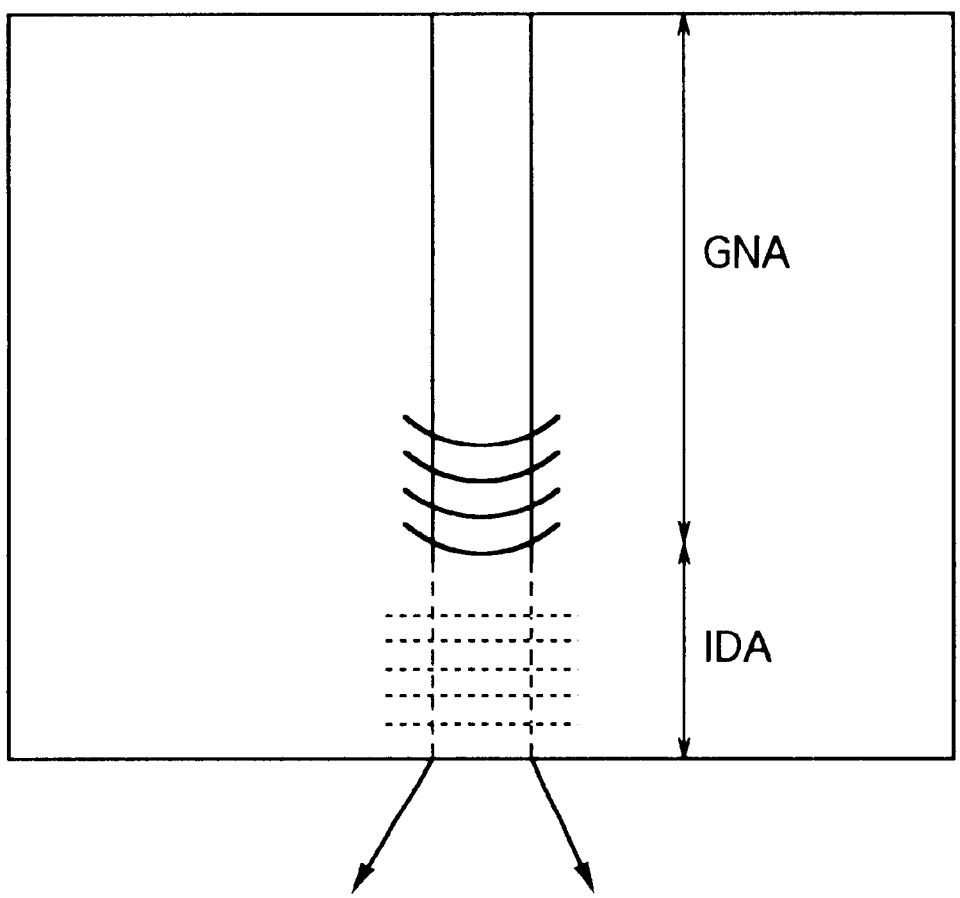
FIG. 12 is a view of the state of change of a gain index and a waveguide surface of a hybrid waveguide.
Figure 13A:
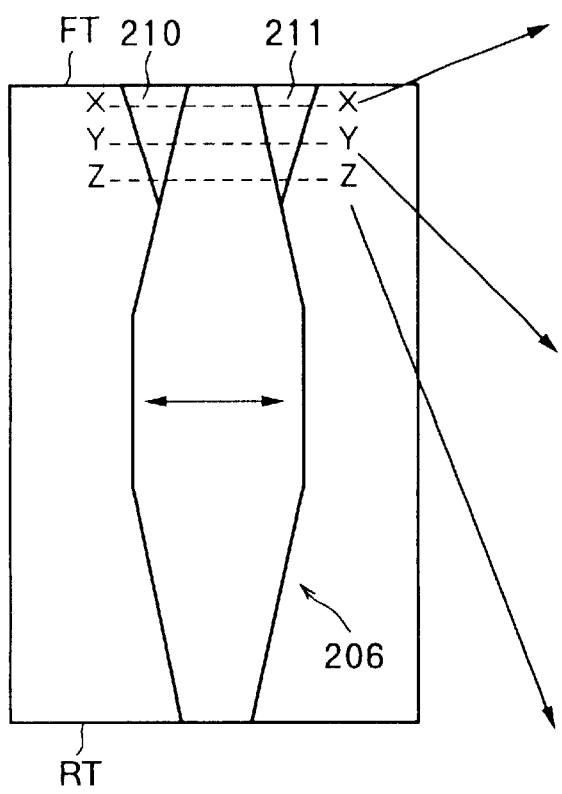
FIGS. 13A to 13D are views for explaining a structure of a connection portion of a gain guide portion and an index guide portion.
Figure 13B:
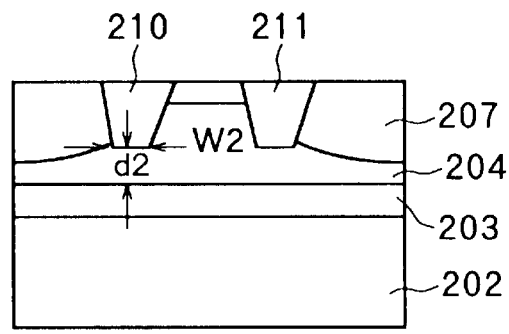
Figure 13C:
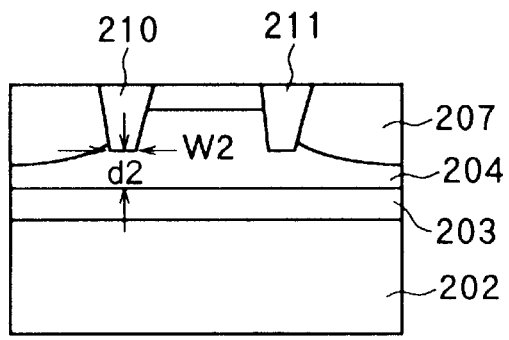
Figure 13D:
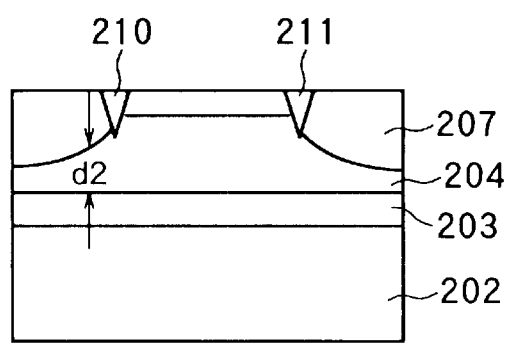

As shown in FIG. 12, in the gain guide area GNA, the waveguide surface is curved. This is the cause of the astigmatism difference. It is necessary to convert such a curved wave surface to the plane wave surface of the index guide area IDA free from astigmatism difference, but when simply connecting them, it becomes impossible to smoothly convert the wave surface since the inherent wave surface states are different from each other.

For this reason, reflection or scattering occurs at the connection portion and energy loss is produced.

In order to solve this, not a simple ridge structure, but an approximate W-type ridge structure in which grooves 210 and 211 are formed at the two sides near the front end surface FT of the stripe portion 206 is applied.

In the grooves 210 and 211, as shown in FIG. 13, by making the distance d2 between the active layer and the groove bottom surface slightly large at the connection portion between the gain guide area GNA and the index guide area IDA and making the groove width w2 narrow, the effective refractive index difference Δn of the lateral direction (direction perpendicular to the resonator length direction) is made slightly small and the difference from the refractive index difference (n=0) of the gain guide area GNA is made small.

Then, by gradually changing the distance d2 to become slightly smaller and groove width w2 to become slightly wider the closer to the front end surface FT, the refractive index difference Δn is increased and made close to the value of the final index guide, i.e., about 0.01.

By doing this, the constitution is made so that the wave surface smoothly changes and the astigmatism difference can be corrected inside the laser while reducing the energy loss.

The principal parameters in the ridge structure near the entire end surface are the stripe width w1 of the end surface, groove width w2, distance d2 between the active layer and the groove bottom surface, and the conversion region length Lf from the gain to the index as shown in FIG. 9 and FIG. 10.

Below, an explanation will be made of the set conditions.

It is necessary that the stripe width w1 of the end surface is not made too wide so that the high order mode is cut off.

Further, since this is the main factor determining the beam spread angle θ// of the parallel direction of the FFP, it is determined so as to satisfy the specifications. It may be equivalent to the usual index guide at the end surface and is set to about 2 to 4 μm.

The width becomes broader at the connection portion with the gain guide and is set to about 6 to 8 μm. This is a value approximately the same as the width w3 of the wide width stripe portion.

Note that the taper stripe structure necessary in a pure gain guide-type semiconductor laser is not always necessary in a so-called hybrid guide as in the present embodiment.

If the groove width w2 is wide, the effective refractive index difference Δn can be made large. From the degree of spread of the lateral mode in the waveguide state of the index guide, if this groove width w2 is about 5 μm or more, a substantially sufficient refractive index difference can be obtained and the groove acts as an index guide.

The groove width w2 is made narrow at a position away from the end surface and connected to the gain guide since a smooth change to the gain guide can be achieved within a range of 0≦w2≦5 μm.

Note that this change may also be made linear.

Also the value of the distance d2 between the active layer and the groove bottom surface changes the refractive index difference Δn. The larger the distance d2, the smaller the refractive index difference Δn.

Accordingly, the effect is exhibited in a region in which a small refractive index difference is necessary which cannot be dealt with by just the change of the groove width w2.

As a simple structure, the distance d2 may be constant, but desirably the distance d2 is gradually increased after the groove width w2 becomes 0 in order to make the connection with the gain guide smooth.

If the conversion region length Lf from the gain to the index is too short, the loss at the conversion is increased.

In general, the loss can be ignored so far as the following relationship used as the taper stripe structure is satisfied:

$$Lf \geq w3 \, (w3/w1-1)/\sin^{-1}(n1/n2)$$

Here, n1 represents the refractive index of the outside portion of the waveguide, n2 a refractive index inside the waveguide, w1 the stripe width of the end surface, and w3 the stripe width at the gain guide region.

The present condition is obtained from the demand that the light generated inside the waveguide satisfy the full reflection condition.

As representative values, if w3=8 μm, w1=4 μm, n2=3.5, and n1=3.465, Lf becomes larger than 12 μm. Usually, it is seen that an Lf of several tens of μm is satisfactory.

It is possible to fabricate such a ridge structure having such wedge-type grooves for a smooth change from the gain guide to the index in for example the following way.

For example, by forming a window (opening) corresponding to the groove by lithography and forming the ridge groove by chemical etching, it is possible to form the desired structure with a good reproducibility.

Figure 14:
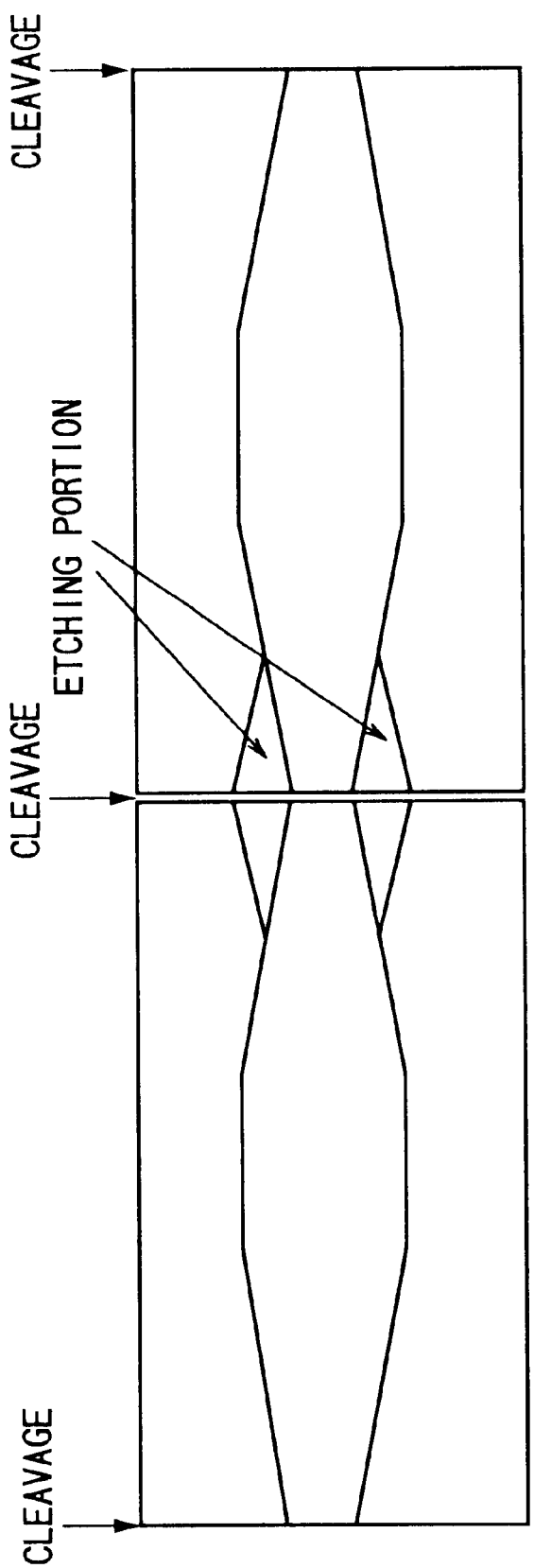
FIG. 14 is a view explaining a method for producing a semiconductor laser according to the fifth embodiment.

The specific method of fabrication is shown in FIG. 14.

The window is opened by a photolithography step in the part in which the ridge groove is etched in a wafer state, and this part is etched.

Next, the end surface portion is formed by cleavage.

It is sufficient to form the index guide mechanism in the region of the front end surface, therefore the etched ridge portion may be formed at intervals.

Since the ridge can be formed in the intended part easily by the wafer process in this way, there is no increase in the number of complex steps lowering the manufacturing yield compared with the usual gain guide.

As described above, according to the fifth embodiment, the grooves 210 and 211 are formed at the two sides near the front end surface FT of the stripe portion 206. The grooves 210 and 211 make the distance d2 between the active layer and the groove bottom surface slightly larger at the connection portion between the gain guide area GNA and the index guide area IDA and make the groove width w2 narrower to make the effective refractive index difference Δn of the lateral direction (direction perpendicular to the resonator length direction) slightly smaller, make the difference from the refractive index difference of the gain guide area GNA (n=0) small, and gradually change the distance d2 to become slightly small and the groove width w2 to become slightly wide closer to the front end surface FT, the refractive index difference Δn is made to increase to close to the final value of index guide, i.e., about 0.01, the wave surface smoothly changes and the astigmatism difference can be corrected inside the laser while reducing the energy loss.

Namely, the astigmatism difference characteristic of the index guide can be reduced to within several μm while making good use of the vertical multi-mode property characteristic of the gain guide.

That is, the focus spot system can be made small while securing the low noise characteristic resistant to returned light.

Accordingly, when the laser is used for a light source for an optical disc device, a low jitter better than that heretofore can be realized.

Further, the structure according to the present invention can be realized while giving almost no additional process load to the process of manufacturing a usual gain guide-type semiconductor laser. Accordingly, there is the advantage that a manufacturing yield comparable to that of the products of the related art or a further improvement of the manufacturing yield due to the improvement of characteristics can be expected, so a high quality and low cost can be realized.

Further, the threshold value and differentiation efficiency of the usual gain guide-type semiconductor laser can be enhanced and the reliability can be improved.

Sixth Embodiment

Figure 15:
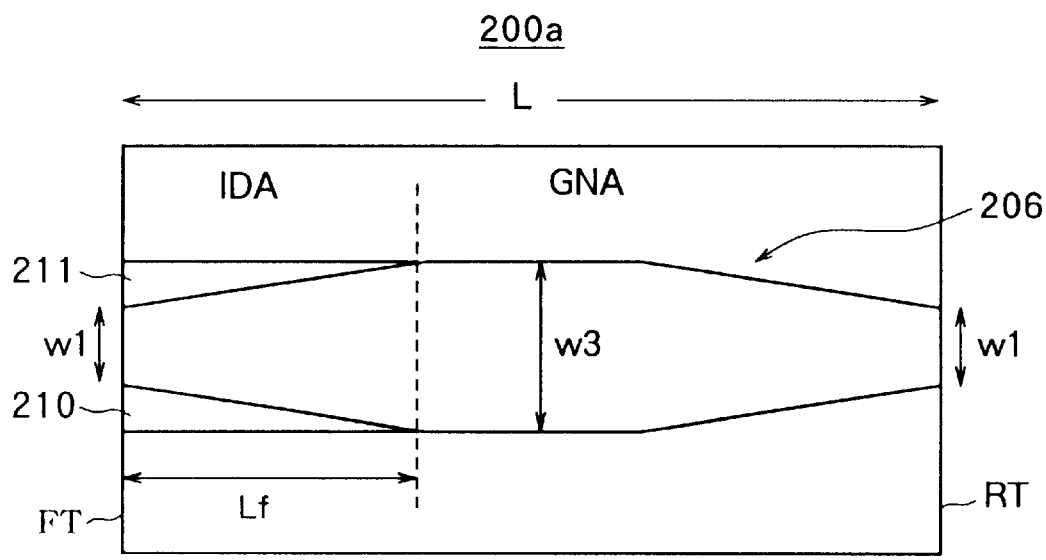
FIG. 15 is a plan view of a semiconductor laser according to a sixth embodiment of the present invention.

FIG. 15 is a plan view of a the semiconductor laser according to a sixth embodiment of the present invention.

The difference of the sixth embodiment from the fifth embodiment resides in that the conversion region length Lf (index guide area IDA) from the gain to the index is set further longer.

In this way, when the index guide area IDA is set to be slightly longer, the characteristic of the index guide strongly appears as the laser characteristic.

That is, the astigmatism difference becomes further smaller and the vertical single mode property is strengthened.

For this reason, the quantum noise is reduced from that of the pure gain guide-type semiconductor laser, but the laser becomes slightly weak against the returned light noise.

Note that if the conversion region length Lf is short, the gain guide-like nature is strengthened.

By adjusting this length in accordance with the purpose of the application of the laser, the optimum characteristic can be realized.

Seventh Embodiment

Figure 16:
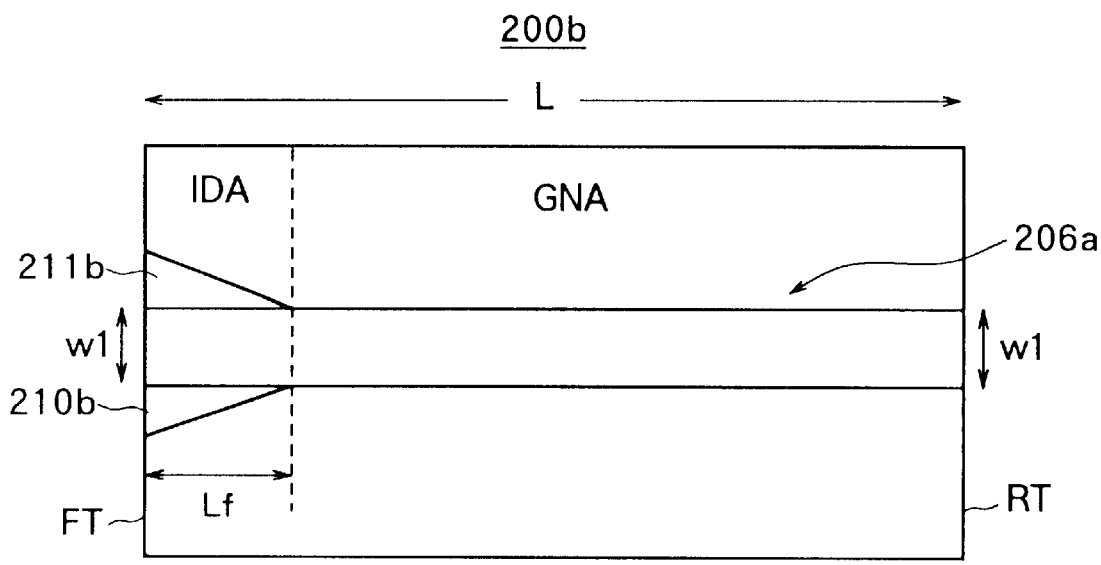
FIG. 16 is a plan view of a semiconductor laser according to a seventh embodiment of the present invention.

FIG. 16 is a plan view of a semiconductor laser according to a seventh embodiment of the present invention.

The difference of the seventh embodiment from the sixth embodiment resides in that, not a taper stripe, but a straight stripe is adopted.

The advantages of the straight. stripe with the relatively narrow width in the gain guide are that it the vertical multimode is easily achieved, the astigmatism difference is small, the kink level is raised, the beam spread angle θ// of the parallel direction of the FFP is spread, etc., but there are also disadvantages such as a rise of a threshold current Ith and the reduction of the differentiation efficiency.

However, in the device of the present invention, since the ridge structure near the end surface is introduced, the waveguide loss can be reduced and the rise of the threshold current Ith and the reduction of the differentiation efficiency can be alleviated so the above disadvantages can be solved.

Note that in the fifth, sixth, and seventh embodiments, the explanation was made by taking as an example the case where the index guide area was provided at the light emitting front end surface, but the present invention is not limited to this. It is also possible to provide this near the rear end surface or near both of the front end surface and rear end surface. Similar effects to those by the fifth, sixth, and seventh embodiments can be obtained also in these cases.

Eighth Embodiment

Figure 17:
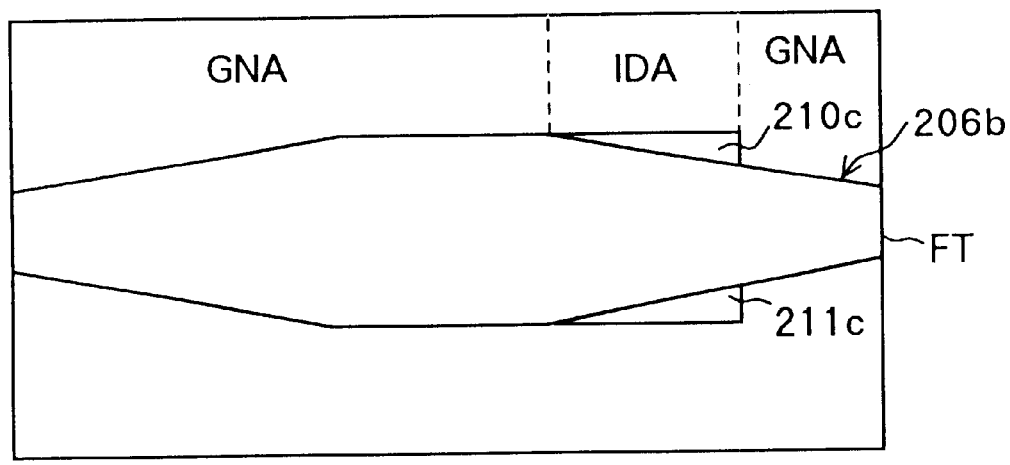
FIG. 17 is a plan view of a semiconductor laser according to an eighth embodiment of the present invention.

FIG. 17 is a plan view of a semiconductor laser according to an eighth embodiment of the present invention.

The difference of the eighth embodiment from the fifth embodiment resides in that the index guide area IDA is not formed up to the light emitting end surface, but is arranged in an intermediate region between the center of the resonator and the forward end surface FT and that the position near the light emitting end surface acts as the gain guide area GNA again.

As in the fifth embodiment, when the index guide area IDA is formed up to the light emitting end surface, the waveguide of the lateral direction becomes close to that of a plane wave due to the existence of the index guide structure.

Concerning the vertical direction, however, the index guide area of the lateral direction is sensed as a loss (scattering) area of the light, therefore a strong recessed curve is liable to be caused near the end surface.

Therefore, in the eighth embodiment, the index guide area IDA is shifted slightly to the internal portion of the waveguide, this internal index guide area IDA is made to act as an active lateral mode filter, and this is used as a lateral mode decision region of the lateral direction.

Due to this, when considering the vertical direction mode not only for near the end surface, but also for the entire resonator, the active layer portion does not become a large loss region and the recessed curve is reduced.

Ninth Embodiment

Figure 18:
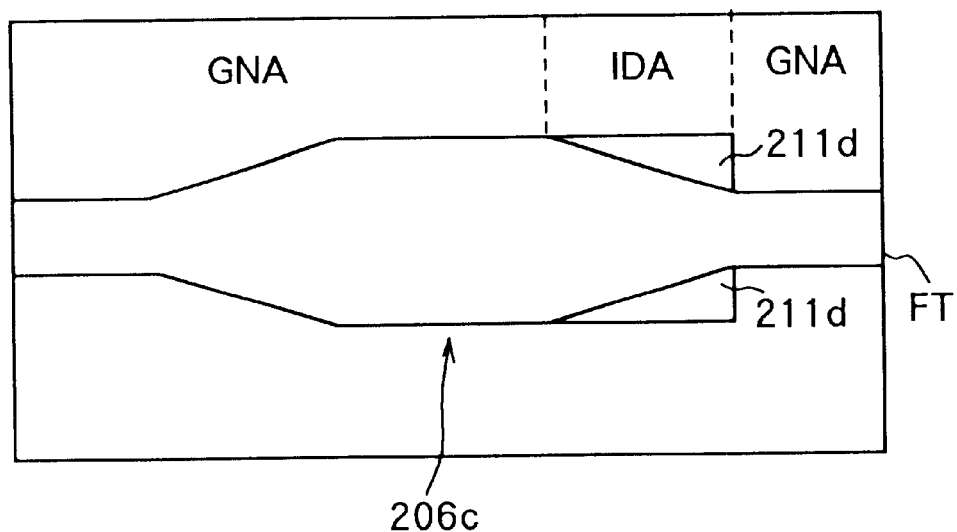
FIG. 18 is a plan view of a semiconductor laser according to a ninth embodiment of the present invention.

FIG. 18 is a plan view of a semiconductor laser according to a ninth embodiment of the present invention.

The difference of the ninth embodiment from the eighth embodiment resides in that the gain guide area between the index guide area IDA and the light emitting end surface is made a straight stripe structure.

By adopting such a configuration, there are the advantages that the loss can be reduced and the shaping effect of the wave surface of the vertical direction can be manifested.

10th Embodiment

Figure 19:
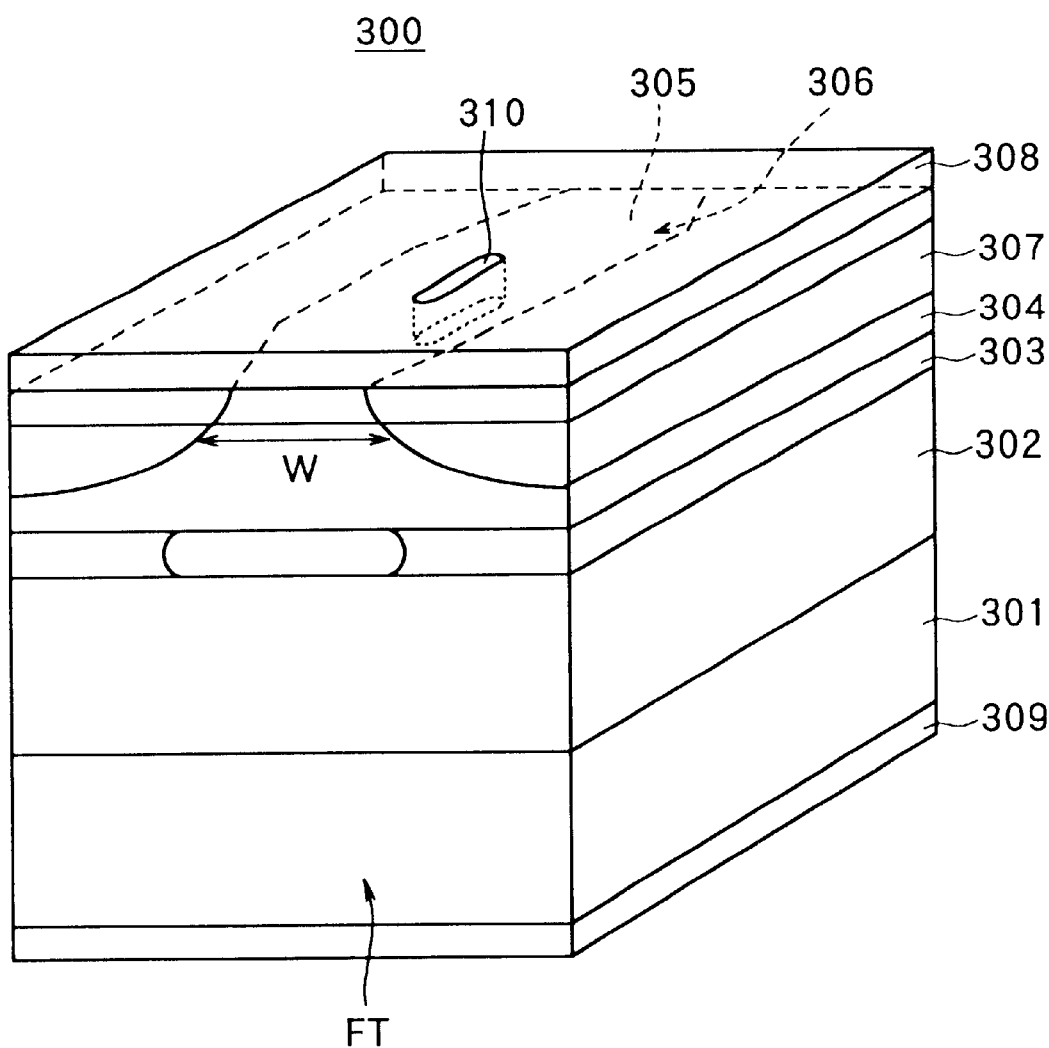
FIG. 19 is a perspective view of a semiconductor laser according to a 10th embodiment of the present invention.
Figure 20:
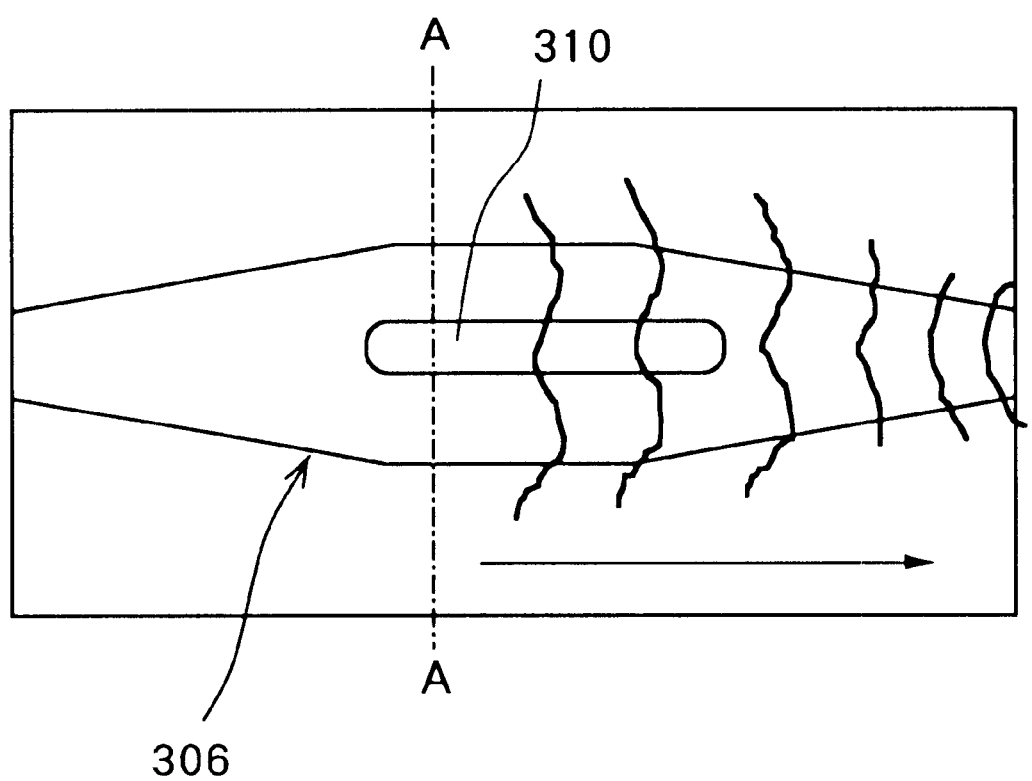
FIG. 20 is a plan view of a semiconductor laser according to the 10th embodiment of the present invention.
Figure 21:
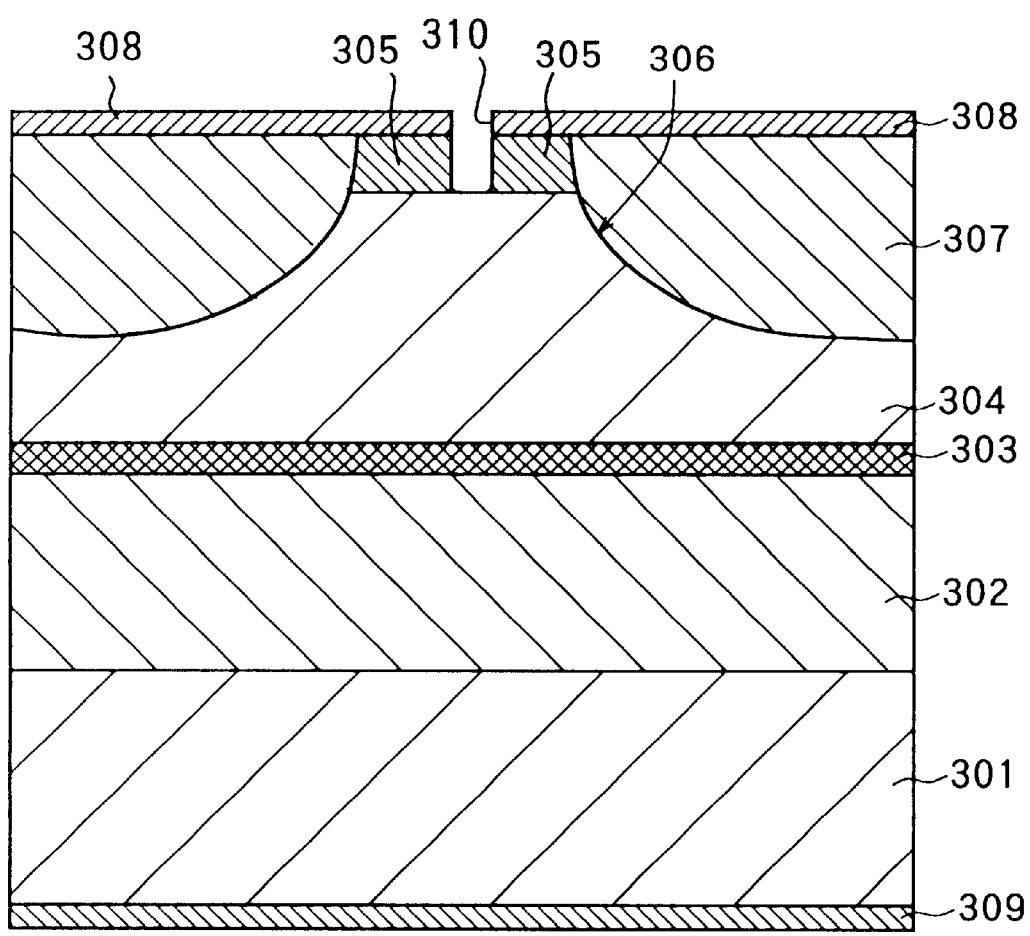
FIG. 21 is a sectional view taken along a line A—A in FIG. 20.

FIG. 19 is a perspective view of a gain guide-type semiconductor laser according to a 10th embodiment of the present invention, FIG. 20 is a plan view of a gain guide-type semiconductor laser according to the 10th embodiment of the present invention, and FIG. 21 is a sectional view taken along a line A—A in FIG. 19.

As shown in the figures, this gain guide-type semiconductor laser 300 is comprised of an n-type GaAs substrate 301 on which an n-type AlGaAs cladding layer 302, AlGaAs active layer 303, p-type AlGaAs cladding layer 304, and p-type GaAs cap layer 305 are successively stacked.

This semiconductor laser has a stripe portion 306 extending in one direction.

At the two side parts of this stripe portion 306, a current narrowing layer 307 is formed with a resistance raised by ion implantation of for example $B^+$ ions.

On the p-type GaAs cap layer 305 and the current narrowing layer 307 is provided a p-side electrode 308 such as a Ti/Pt/Au electrode.

On the other hand, on the back surface of the n-type GaAs substrate 301 is provided an n-side electrode 309 such as an AuGe/Ni/Au electrode.

Note that the ratios of compounds of the n-type AlGaAs cladding layer 302, AlGaAs active layer 303, and p-type AlGaAs cladding layer 304 parts in the semiconductor laser 300 according to the 10th embodiment are set so as to become for example $Al_{0.5}Ga_{0.5}As$ for the n-type cladding layer 302 and the p-type cladding layer 304 and $Al_{0.12}Ga_{0.88}As$ for the active layer 303.

Further, in the case of the semiconductor laser 300, the basic laser structure is mainly that of a gain guide-type semiconductor laser, therefore the waveguide is constituted as a tapered waveguide forming a taper where the stripe width becomes wide at the center portion, but becomes narrow near the end surface as shown in FIG. 20.

In the 10th embodiment, the gain guide-type semiconductor laser 300 having the taper stripe structure is constituted so that, as shown in FIG. 20, a current noninjection portion 310 having a predetermined width is formed over a predetermined length of resonator length direction in the center region of the stripe portion and that the degree of the convex curve of the wave surface in the lateral direction can be corrected to be small.

Note that the current noninjection portion 310 is provided in a recessed state where for example the p-type GaAs cap layer 305 and the p-type electrode 308 are not formed.

Below, an explanation will be made of the wave surface correcting operation by providing the current noninjection portion 310 in the center region of the stripe portion with reference to FIG. 20.

The wave surface curve occurs due to a delay of the wave surface phase at the position where there is a waveguide loss.

In the present semiconductor laser 300, the waveguide loss becomes large in the center region of the stripe portion 306 in which the current noninjection portion 310 is formed.

Accordingly, in the present semiconductor laser 300, as shown in FIG. 20, the waveguide surface will cause a delay between the stripe center portion at which the loss is large and the stripe end portions and bend with respect to the direction of advance of the light.

When this comes near the end surface, the delay part of the two end portions is cut by the effect of the taper structure and a so-called recessed curve wave surface in which only the delay of the center portion remains is exhibited.

On the other hand, the recessed curve wave surface is maintained unless something is done concerning the vertical direction.

Accordingly, the recessed curve wave surface is exhibited in both the vertical and lateral directions and advances in the direction of elimination of the astigmatism difference.

According to the 10th embodiment, in the gain guide-type semiconductor laser 300 having the taper stripe structure, the current noninjection portion 310 having a predetermined width is provided over the predetermined length in the resonator length direction in the center region of the stripe portion, therefore the wave surface in the lateral direction can be corrected from the convex state to the recessed state and thus the astigmatism difference can be corrected well.

11th Embodiment

Figure 22:
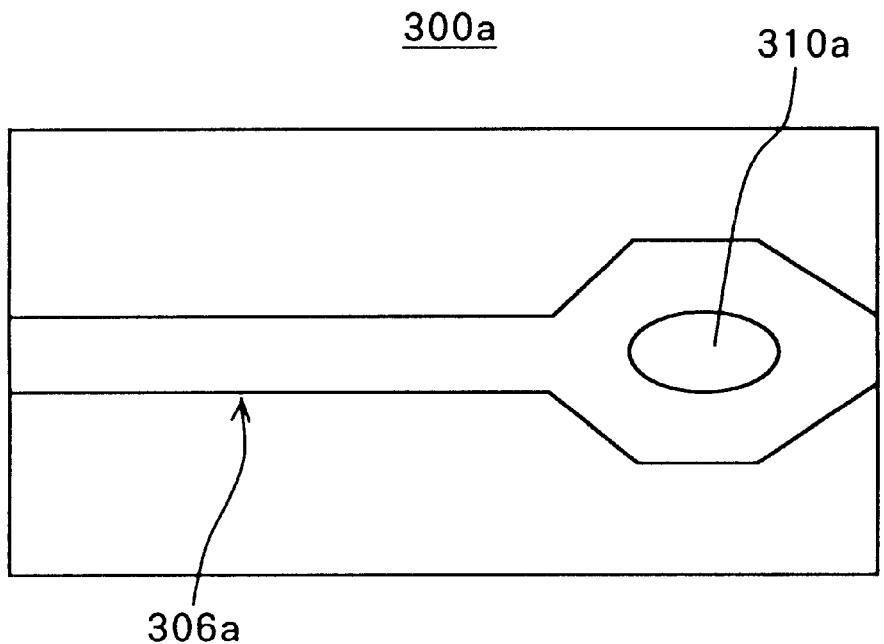
FIG. 22 is a plan view of a semiconductor laser according to an 11th embodiment of the present invention.

FIG. 22 is a plan view of a semiconductor laser according to an 11th embodiment of the present invention.

The difference of the 11th embodiment from the 10th embodiment resides in that a current noninjection portion 310a for causing the waveguide loss of the center portion of the stripe is provided not at the center portion of the resonator length direction, but at the forward end surface side.

Note that a stripe portion 306a between a so-called wave surface curve control area and the light emitting end surface FT containing the current noninjection portion 310a is formed in a taper state where the width thereof gradually becomes smaller the closer to the end surface side.

According to such a configuration, wave surface curve can be further effectively corrected and the taper portion between the wave surface curve control area and the light emitting end surface FT acts as the waveguide region for adjusting the NFP. Due to this, it becomes possible to keep the value of the beam spread angle θ// of particularly parallel direction of FFP suitable.

12th Embodiment

Figure 23:
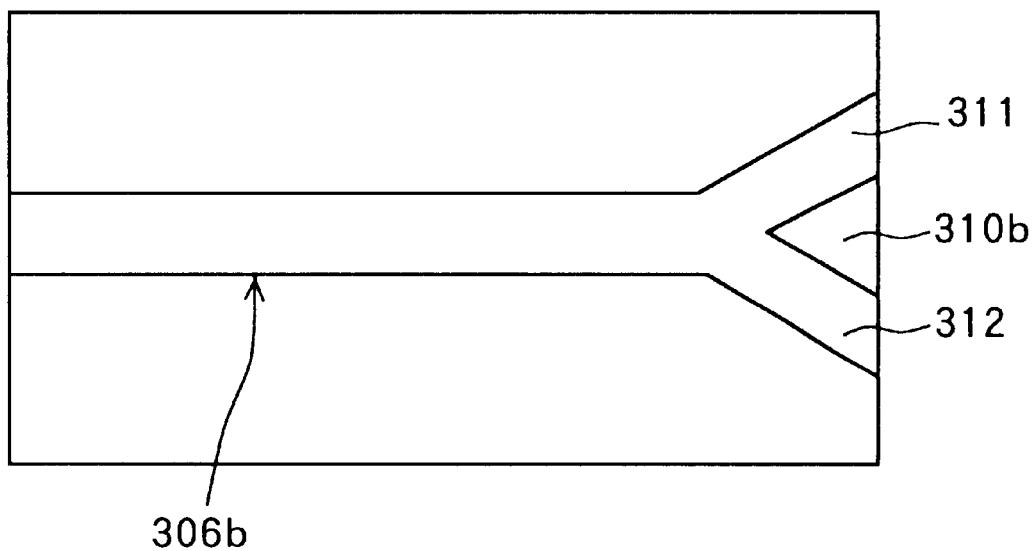
FIG. 23 is a plan view of a semiconductor laser according to a 12th embodiment of the present invention.

FIG. 23 is a plan view of a semiconductor laser according to a 12th embodiment of the present invention.

The difference of the 12th embodiment from the 11th embodiment resides in that a current noninjection portion 310b for causing the waveguide loss of the center portion of the stripe is not provided at the center portion of the resonator length direction, but is branched so as to fork and spread as a Y-shaped waveguide to the forward end surface side and that the tapered portion between the wave surface curve control area and the light emitting end surface FT containing the current noninjection portion 310b is not formed and the end surfaces of the Y-shaped waveguides 311 and 312 are used as the light emitting surfaces.

According to the 12th embodiment, the effect of the recessed state curve of the wave surface can be more largely manifested.

Note that the NFP is liable to be deformed, but the laser is effective for applications not causing problems in application such as for a bar-code reader or a laser printer.

13th Embodiment

Figure 24:
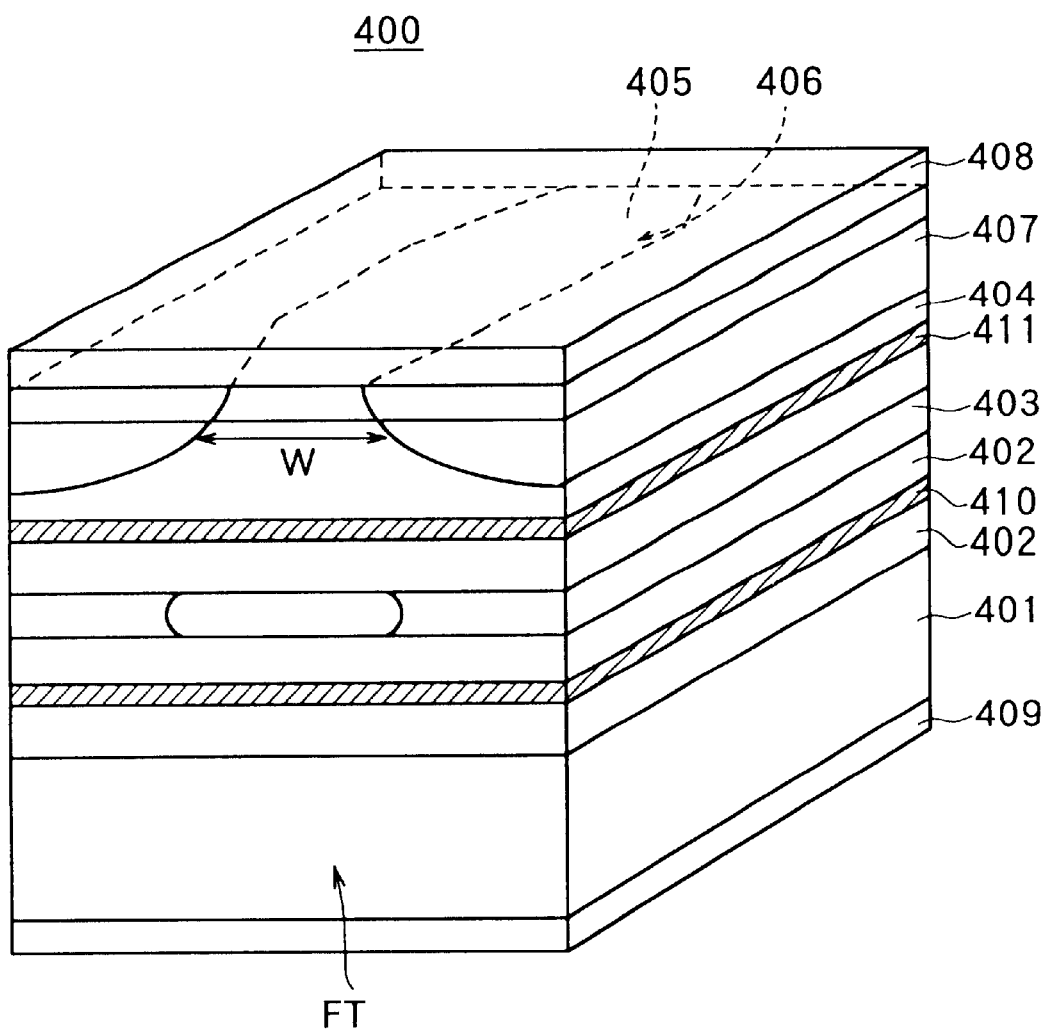
FIG. 24 is a perspective view of a semiconductor laser according to a 13th embodiment of the present invention.

FIG. 24 is a perspective view of a semiconductor laser according to a 13th embodiment of the present invention.

As shown in the figure, this gain guide-type semiconductor laser 400 is comprised of an n-type GaAs substrate 401 on which an n-type AlGaAs cladding layer 402, AlGaAs active layer 403, p-type AlGaAs cladding layer 404, and p-type GaAs cap layer 405 are successively stacked.

This semiconductor laser has a stripe portion 406 extending in one direction.

At both side parts of this stripe portion 406, a current narrowing layer 407 is formed with a resistance raised by ion implantation of for example $B^+$ ions.

On the p-type GaAs cap layer 405 and the current narrowing layer 407 is provided a p-side electrode 408 such as a Ti/Pt/Au electrode.

On the other hand, on the back surface of the n-type GaAs substrate 401 is provided an n-side electrode 409 such as an AuGe/Ni/Au electrode.

In the semiconductor laser 400 according to the 13th embodiment, to form the loss in the vertical direction symmetrical at the part of the outskirts of the optical mode when correcting the recessed curve in the vertical direction to a convex curve, an n-side light absorption layer 410 and a p-side light absorption layer 411 for absorbing the light in the active layer 403 are formed at symmetrical positions in the n-type AlGaAs cladding layer 402 and the p-type AlGaAs cladding layer 404 sandwiching the active layer 403 therebetween.

Note that the n-side light absorption layer 410 is formed as an AlGaAs layer having a lower ratio of Al than the n-type AlGaAs cladding layer 402.

Similarly, the p-side light absorption layer 411 is formed as an AlGaAs layer having a lower ratio of Al than the p-type AlGaAs cladding layer 404.

Figure 25:
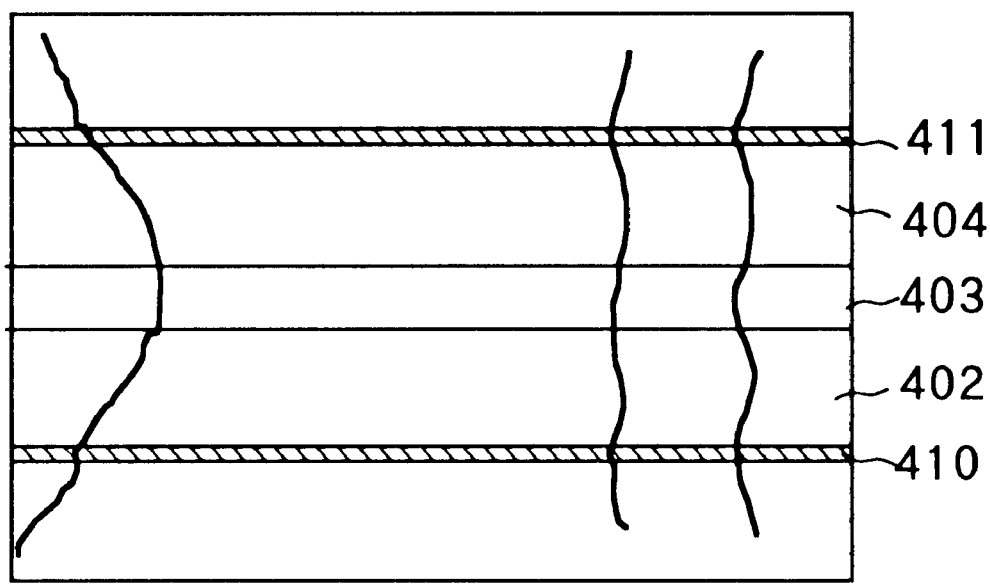
FIG. 25 is a view for explaining a wave surface correction mechanism of a semiconductor laser according o the 13th embodiment.

In the present semiconductor laser 400, since the wave surface is delayed in these light absorption layers 410 and 411 due to the effect of loss of the n-type light absorption layer 410 and the p-type light absorption layer 411, as shown in FIG. 25, the recessed wave surface becomes a wave surface close to a plane and, when the loss becomes further large, becomes a convex curve.

According to the 13th embodiment, by performing the wave surface shaping as mentioned above, a curve close to the lateral direction wave surface curve can be formed and the astigmatism difference can be eliminated.

14th Embodiment

Figure 26:
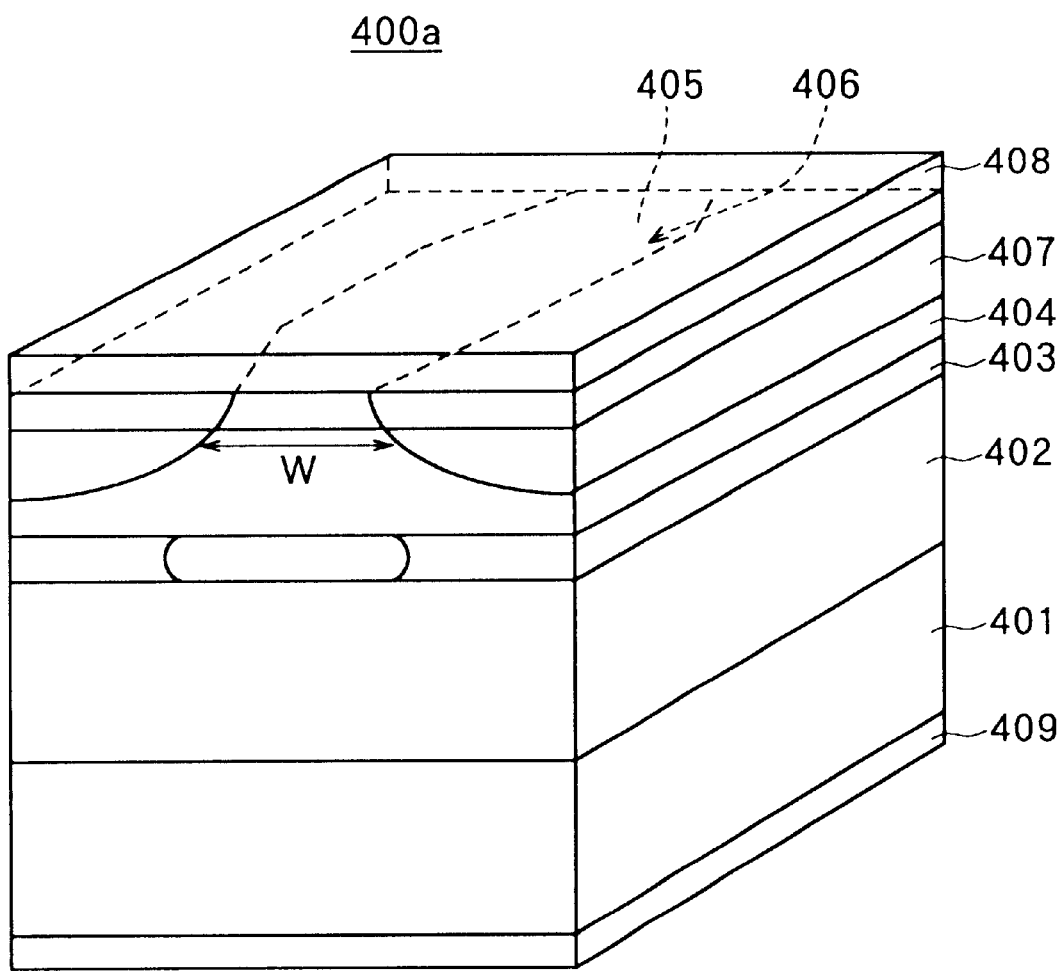
FIG. 26 is a perspective view of a semiconductor laser according to a 14th embodiment of the present invention.

FIG. 26 is a perspective view of a semiconductor laser according to a 14th embodiment of the present invention.

The difference of the 14th embodiment from the 13th embodiment resides in that, in place of providing the light absorption layer, the n-type GaAs substrate 401 and the p-type GaAs cap layer 405 are constituted so as to act as light absorption layers.

Figure 27A:
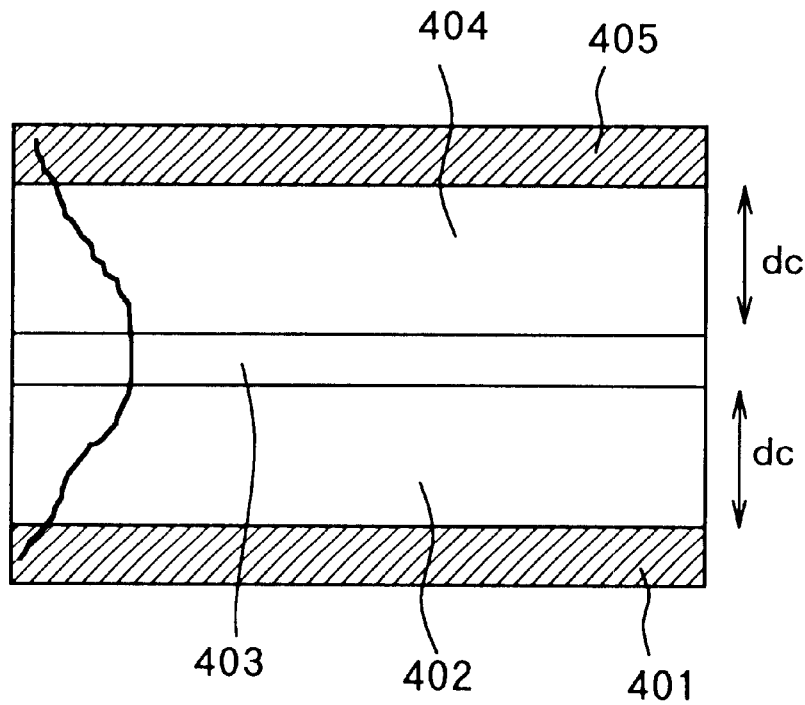
FIGS. 27A and 27B are views for explaining a wave surface correction mechanism of a semiconductor laser according to the 14th embodiment.
Figure 27B:
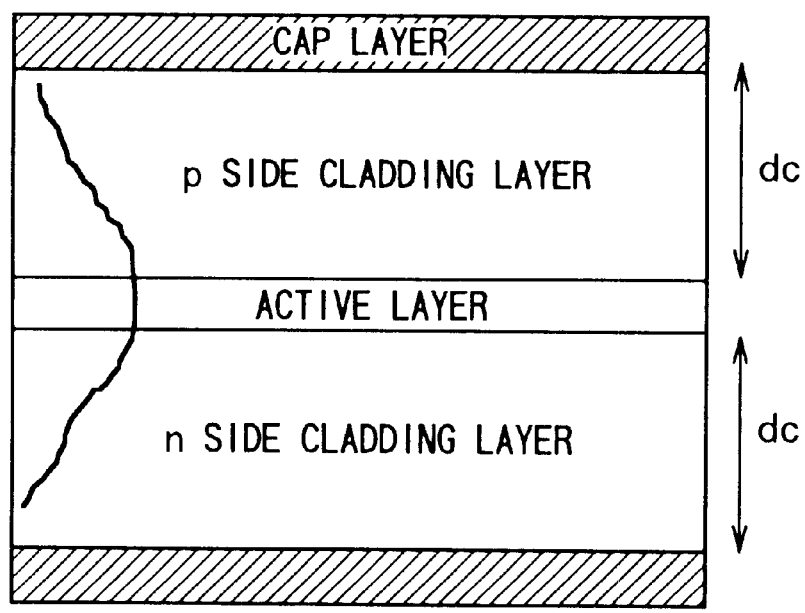
Figure 28:
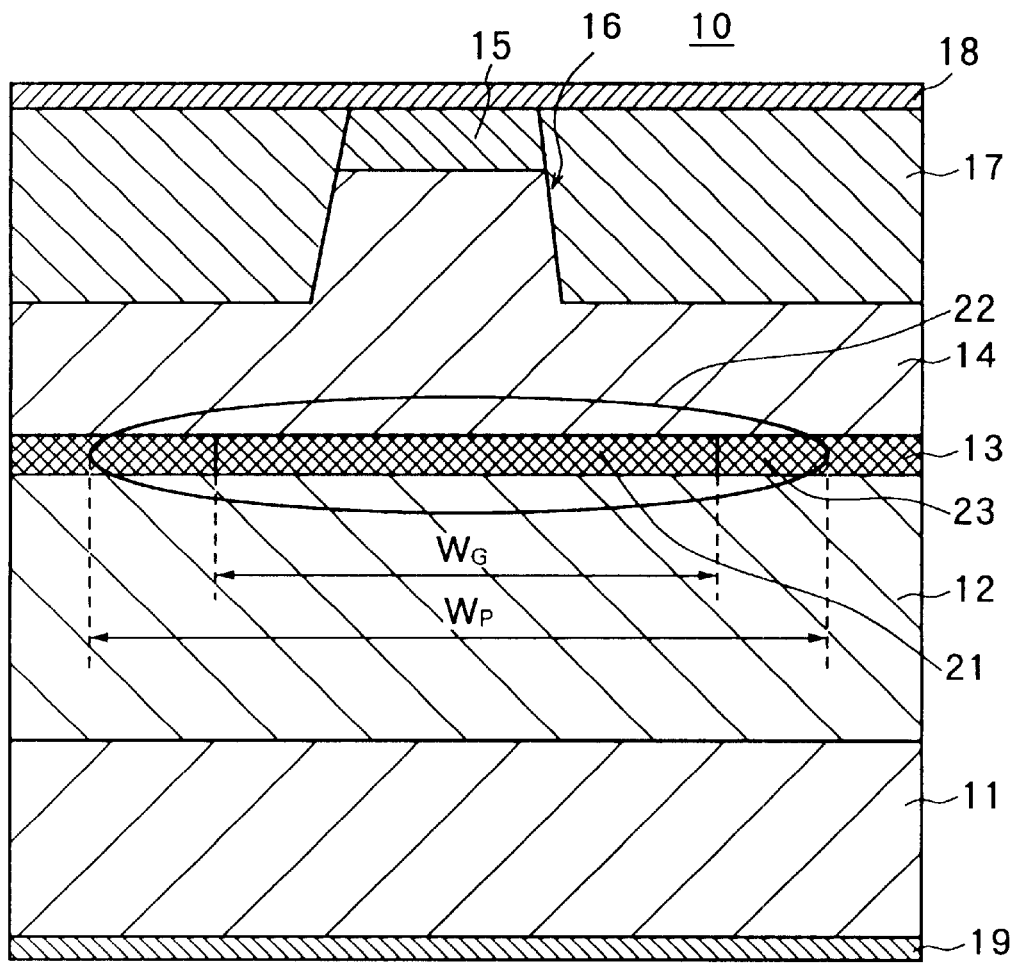
FIG. 28 is a sectional view showing an example of the structure of a self-pulsation type semiconductor laser of the related art.
Figure 29:
FIG. 29 is a schematic graph of the distribution of the refractive index of the self-pulsation type semiconductor laser shown in FIG. 28.
Figure 30:
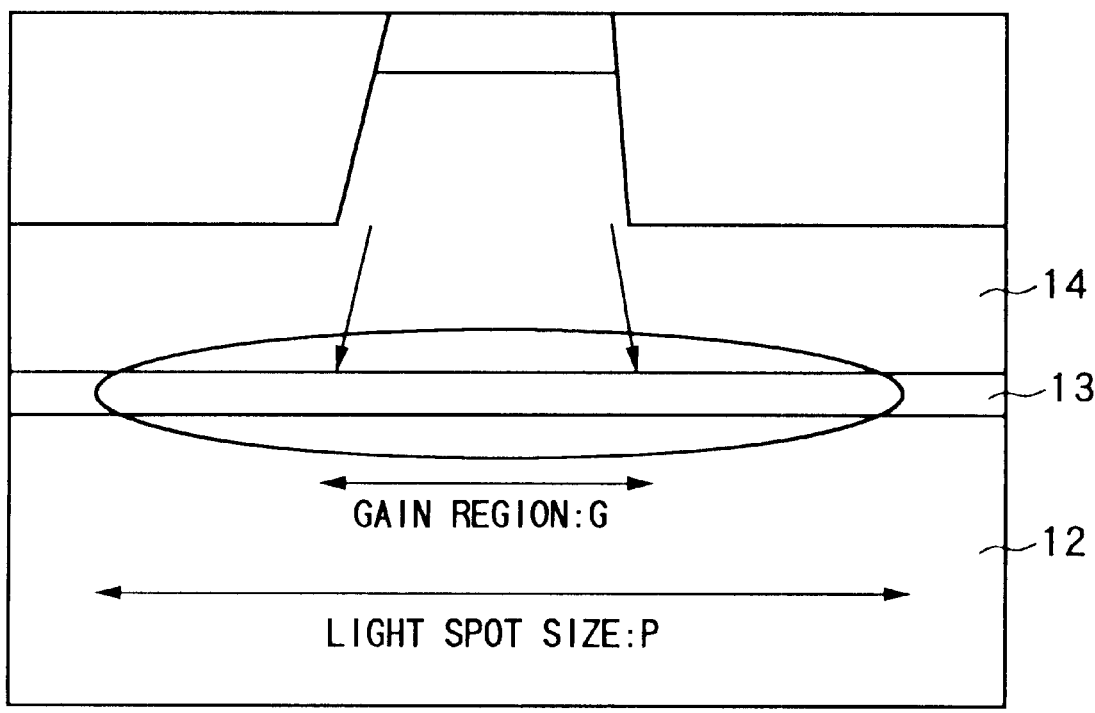
FIG. 30 is a diagrammatical view of the relationship between a gain width and a light spot width of the self-pulsation type semiconductor laser of the related art.
Figure 31:
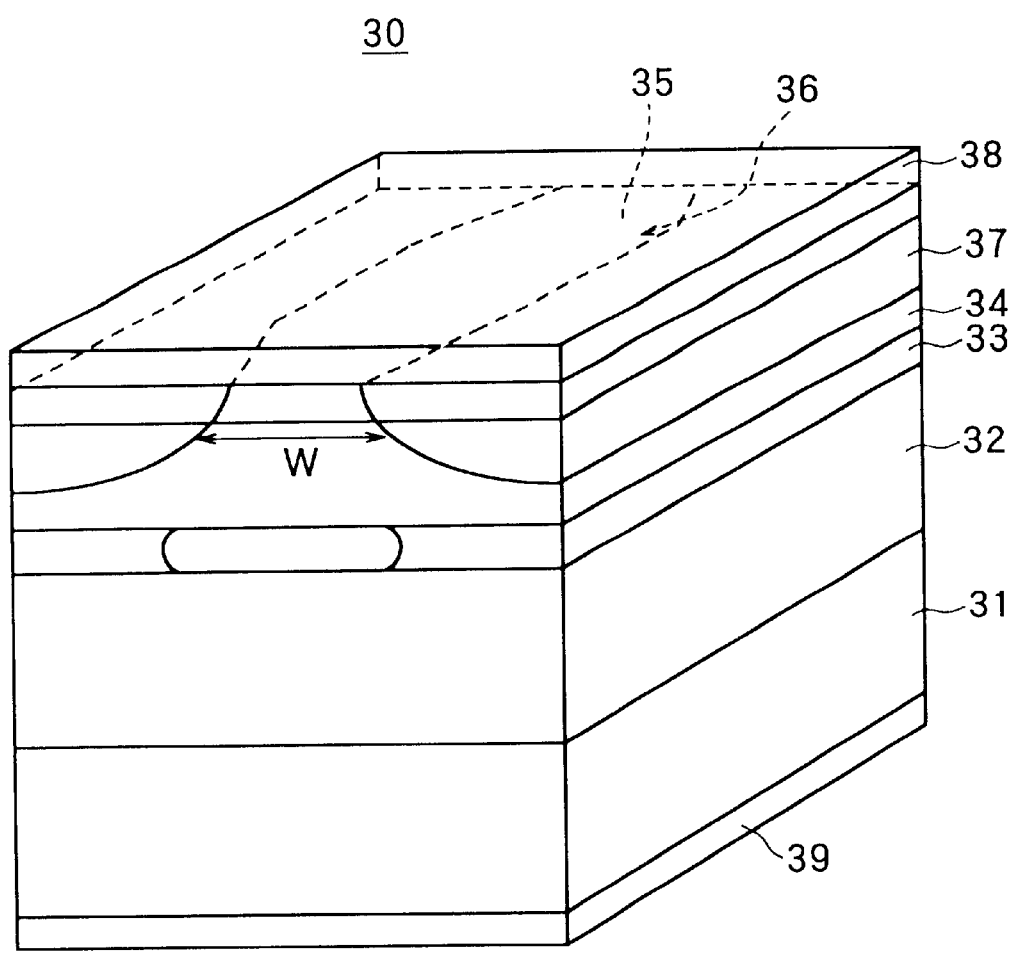
FIG. 31 is a perspective view of an example of the configuration of a gain guide-type semiconductor laser of the related art.
Figure 32:
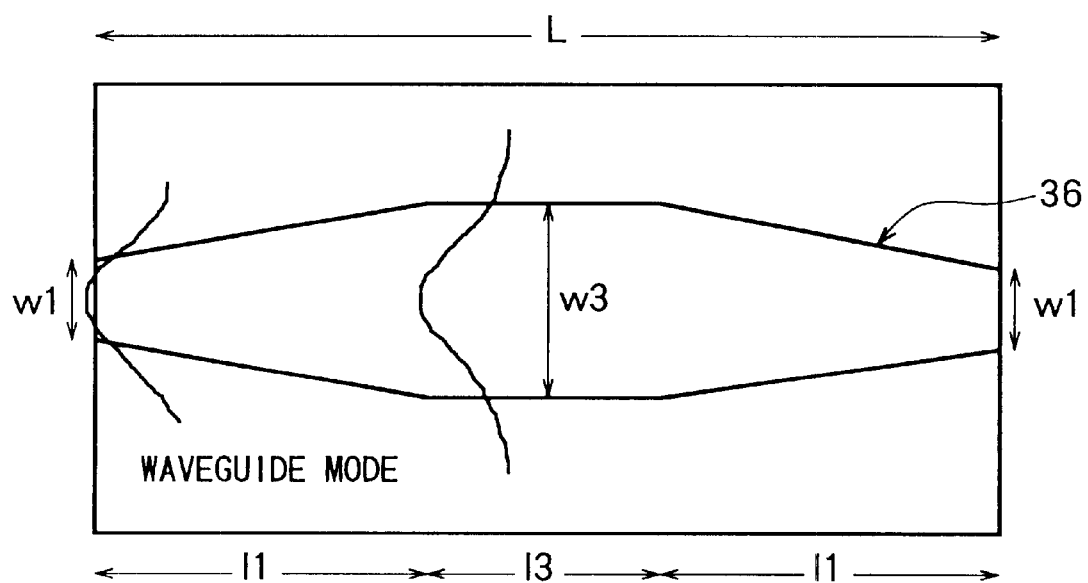
FIG. 32 is a plan view of an example of the configuration of the gain guide-type semiconductor laser of the related art.
Figure 33:
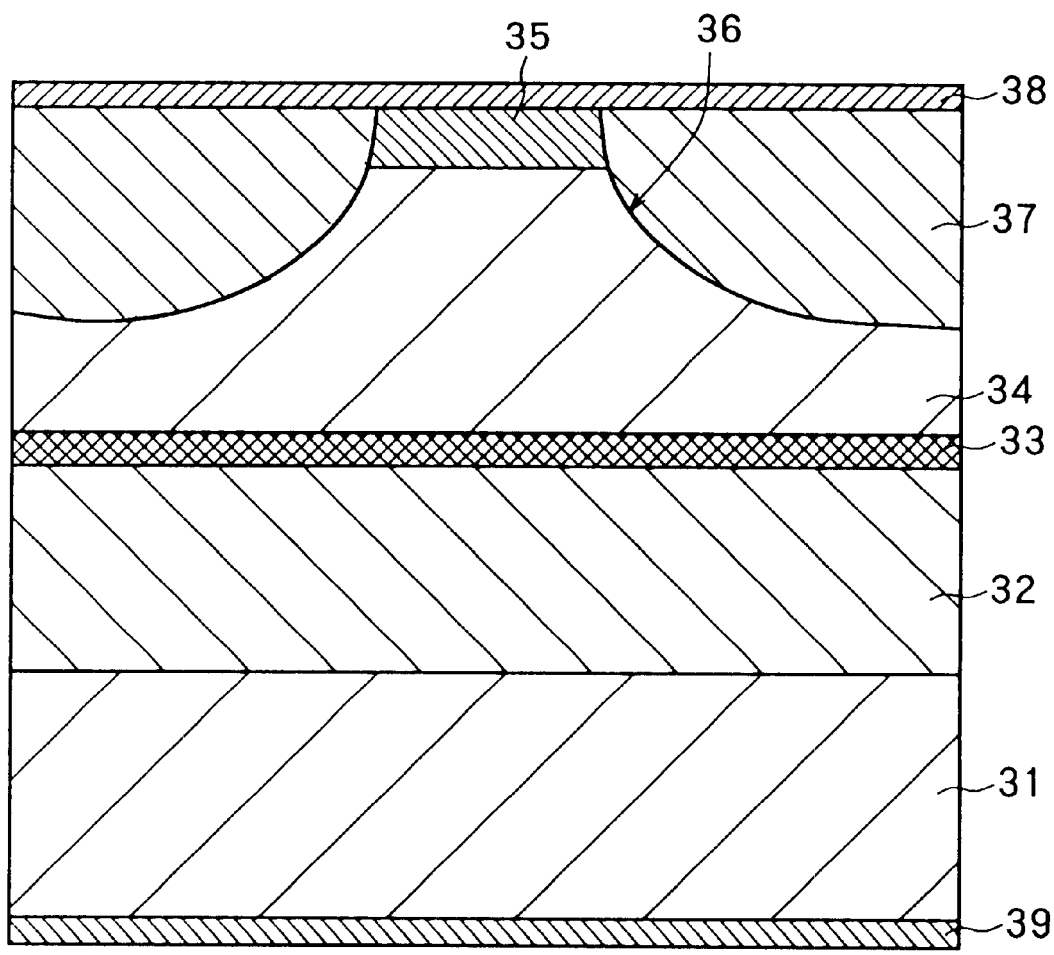
FIG. 33 is a sectional view of an example of the configuration of the gain guide-type semiconductor laser of the related art.

In a usual gain guide-type semiconductor laser, in order to avoid light absorption in these layers and reduce the loss, as shown in FIG. 27(b), the n-type AlGaAs cladding layer 402 and the p-type AlGaAs cladding layer 404 are formed to be sufficiently thick so that the part of the outskirts of the vertical direction optical confinement mode does not reach the n-type GaAs substrate 401 and the p-type GaAs cap layer 405.

Contrary to this, the 14th embodiment is constituted so as to form the n-type AlGaAs cladding layer 402 and the p-type AlGaAs cladding layer 404 thin, so part of the outskirts of the vertical direction optical confinement mode reaches the n-type GaAs substrate 401 and the p-type GaAs cap layer 405 as shown in FIG. 27A.

Due to this, an effect equivalent to that by the 13th embodiment can be obtained, and the wave surface of the vertical direction can be amended from a recessed curve to a convex curve.

Summarizing the effects of the invention, as explained above, according to the present invention, the following effects can be obtained.

1) Case of Index Guide-type Semiconductor Laser

Since the optical mode can be made narrow only near the end surface, the beam spread angle θ// of the parallel direction of the FFP can be spread. In addition, at the center waveguide area, since the optical mode remains wide as it is, there is the advantage that hole burning (HB) does not easily occur and a stable high output operation with a high kink level is easily obtained.

2) Case of Self-pulsation Type Semiconductor Laser

The waveguide mode of the stripe center portion is laterally spread, and in addition, the current can be held in a narrow region. Accordingly, the saturable absorbing region is formed in the lateral region inside the active layer, and the pulsation can be stably induced.

In addition, concerning astigmatism difference, by making the effective refractive index difference Δn near the end surface large, an index guide like waveguide can be obtained, therefore the astigmatism difference can be made close to zero. Further, fixing the mode at this end surface also makes it possible to suppress the change of the beam spread angle θ// of the parallel direction of the FFP by the output.

As a result, there are advantages that it can be applied to an optical system for an optical disc and the compatibility is high.

3) Case of Gain Guide-type Semiconductor Laser

If the ridge separation width is set small so as to cause almost no refractive index difference mentioned in the section on the self-pulsation type semiconductor laser at the center portion, a laser where the center is the gain guide and the end surface portions are the index guide can be easily constituted and a multimode gain guide laser having a low astigmatism difference and single peak FFP characteristic can be realized. Further, since the refractive index difference can be controlled, there is the advantage that it also becomes possible to cause pulsation or make the saturable absorbing region to cause pulsation.

Further, a flare-type can be realized, and high output can also be dealt with.

Further, according to the semiconductor laser of the present invention in which the part near the front end surface is used as the index guide and the remaining part is used as the gain guide, the astigmatism difference characteristic of the index guide can be reduced to within several μm while making good use of the vertical multimode property characteristic of the gain guide, and the focus spot system can be made small while securing the low noise characteristic strong against returned light as it is.

Accordingly, when the laser is used for a light source for an optical disc device, a low jitter better than that heretofore can be realized.

Further, the structure according to the present invention can be realized while giving almost no additional process load to the manufacturing process of a usual gain guide-type semiconductor laser. Accordingly, there is the advantage that a manufacturing yield comparable to that of the products of the related art or a further improvement of the manufacturing yield due to improvement of the characteristics can be expected and a high quality and low cost can be realized.

Further, the threshold value and differentiation efficiency of the usual gain guide-type semiconductor laser can be enhanced and the reliability can be improved.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor light emitting device comprising a first cladding layer of first conductivity type, an active layer formed on the first cladding layer, and a second cladding layer of a second conductivity type formed on the active layer, having a center portion of the second cladding layer forming a ridge structure, and comprising a stripe-shaped current injection structure, wherein:

a second ridge structure is formed on the second cladding layer at the two sides of the stripe portion formed on the second cladding layer via a ridge separation portion formed with a thickness of the stacking direction of the first cladding layer, active layer, and second cladding layer thinner than that of the ridge structure, a waveguide stripe width at the center is constant, and the width in a direction perpendicular to the stacking direction of the ridge separation portion is set so as to be different between the center portion in a resonator direction and near an end surface.

2. A laser semiconductor light emitting device as set forth in claim 1, wherein at least a recessed portion of the second cladding layer forming the ridge separation portion has a current narrowing structure in which a current narrowing layer of the first conductivity type is buried.

3. A semiconductor light emitting device as set forth in claim 1, wherein an insulating film is formed in at least one part of an upper surface of the second cladding layer except a top surface of the second cladding layer forming the ridge structure at the center portion.

4. A semiconductor light emitting device as set forth in claim 1, wherein a current injection use cap layer is formed on the top surface of the second cladding layer forming the ridge structure at the center portion and in one part of the top surface of the second cladding layer forming the second ridge structure.

5. A semiconductor light emitting device as set forth in claim 3, wherein a current injection use cap layer is formed on the top surface of the second cladding layer forming the ridge structure at the center portion and in one part of the top surface of the second cladding layer forming the second ridge structure.

6. A semiconductor light emitting device comprising a first cladding layer of a first conductivity type, an active layer formed on the first cladding layer, and a second cladding layer of a second conductivity type formed on the active layer, having a center portion of the second cladding layer forming a ridge structure, and comprising a stripe-shaped current injection structure, wherein:

the second ridge structure is formed on the second cladding layer on at the two sides of the stripe portion formed on the second cladding layer via a ridge separation portion formed with a thickness of the stacking direction of the first cladding layer, active layer, and second cladding layer thinner than that of the ridge structure, the waveguide stripe width at the center is constant, and the width in the direction perpendicular to the stacking direction of the ridge separation portion is set so as to be narrow at the center portion in the resonator direction and broader than that at the center portion near the end surface.

7. A semiconductor light emitting device comprising a first cladding layer of a first conductivity type, an active layer formed on the first cladding layer, and a second cladding layer of a second conductivity type formed on the active layer, having a center portion of the second cladding layer forming a ridge structure, and comprising a stripe-shaped current injection structure, wherein:

the second ridge structure is formed on the second cladding layer at the two sides of the stripe portion formed on the second cladding layer via the ridge separation portion formed with a thickness in the stacking direction of the first cladding layer, active layer, and second cladding layer thinner than that of the ridge structure, the waveguide stripe width at the center is constant, and the width in the direction perpendicular to the stacking direction of the ridge separation portion is set so as to be wide at the center portion in the resonator direction and narrower than that at the center portion near the end surface.

8. A semiconductor light emitting device comprising a first cladding layer of a first conductivity type, an active layer formed on the first cladding layer, and a second cladding layer of a second conductivity type formed on the active layer, having a center portion of the second cladding layer forming a ridge structure and comprising a stripe-shaped current injection structure, wherein:

a waveguide mechanism comprises an index guide area formed at one of a position near a light emitting front end surface for emitting a laser beam and a position near a rear end surface and having a built-in refractive index difference for the waveguide in a lateral direction perpendicular to a resonator length direction and a gain guide area formed in the region except the index guide area and not having the built-in refractive index difference.

9. A semiconductor light emitting device as set forth in claim 8, wherein, in the index guide area, the index guide mechanism is constituted so that the refractive index difference is gradually increased over a range from a connection portion with the gain guide area to the light emitting front end surface.

10. A semiconductor light emitting device as set forth in claim 9, wherein the index guide mechanism is constituted by grooves formed on the two sides of the stripe portion and formed so that the groove width thereof gradually becomes larger over a range from the connection portion with the gain guide area to the light emitting front end surface.

11. A semiconductor light emitting device as set forth in claim 9, wherein the index guide mechanism is constituted by grooves formed on the two sides of the stripe portion and formed so that a distance from a bottom surface of the groove to the active layer gradually becomes smaller over the range from the connection portion with the gain guide area to the light emitting front end surface.

12. A semiconductor light emitting device as set forth in claim 9, wherein the index guide mechanism is constituted by grooves formed on the two sides of the stripe portion and formed so that the groove width gradually becomes larger over the range from the connection portion with the gain guide area to the light emitting front end surface and the distance from the bottom surface of the groove to the active layer gradually becomes smaller over the range from the connection portion with the gain guide area to the light emitting front end surface.

13. A semiconductor light emitting device as set forth in claim 8, wherein the stripe portion forms a taper shape with a width which is wide at the center portion and becomes narrow near the end surface.

14. A semiconductor light emitting device as set forth in claim 9, wherein the stripe portion forms a taper shape with a width which is wide at the center portion and becomes narrow near the end surface.

15. A semiconductor light emitting device as set forth in claim 10, wherein the stripe portion forms a taper shape with a width which is wide at the center portion and becomes narrow near the end surface.

16. A semiconductor light emitting device as set forth in claim 11, wherein the stripe portion forms a taper shape with a width which is wide at the center portion and becomes narrow near the end surface.

17. A semiconductor light emitting device as set forth in claim 12, wherein the stripe portion forms a taper shape with a width which is wide at the center portion and becomes narrow near the end surface.

18. A semiconductor light emitting device as set forth in claim 8, wherein the stripe portion forms a schematically uniform straight shape over the entire width thereof.

19. A semiconductor light emitting device as set forth in claim 9, wherein the stripe portion forms a schematically uniform straight shape over the entire width thereof.

20. A semiconductor light emitting device as set forth in claim 10, wherein the stripe portion forms a schematically uniform straight shape over the entire width thereof.

21. A semiconductor light emitting device as set forth in claim 11, wherein the stripe portion forms a schematically uniform straight shape over the entire width thereof.

22. A semiconductor light emitting device as set forth in claim 12, wherein the stripe portion forms a schematically uniform straight shape over the entire width thereof.

* * * * *